(12) United States Patent
Ootani et al.

(10) Patent No.: US 6,353,309 B1
(45) Date of Patent: Mar. 5, 2002

(54) SWITCHING CIRCUIT HAVING A SWITCHING SEMICONDUCTOR DEVICE AND CONTROL METHOD THEREOF

(75) Inventors: Mitsuaki Ootani; Yoshiyuki Wasada; Nobuyuki Yamazaki; Yasushi Inoue; Takeshi Nakayama; Junichi Shimamura; Yuji Ebinuma; Takayuki Tsukamoto, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/608,023

(22) Filed: Jun. 29, 2000

(30) Foreign Application Priority Data

Jun. 29, 1999 (JP) ............................................. 11-184208

(51) Int. Cl.[7] ................................................. G05F 1/40
(52) U.S. Cl. ...................................................... 323/282
(58) Field of Search ................................. 323/223, 225, 323/226, 268, 269, 273, 274, 282, 284

(56) References Cited

U.S. PATENT DOCUMENTS

| | | | | |
|---|---|---|---|---|
| 4,384,321 A | * | 5/1983 | Rippel | ......................... 363/124 |
| 5,559,685 A | * | 9/1996 | Lauw et al. | ................... 363/37 |
| 5,909,108 A | * | 6/1999 | He et al. | ..................... 323/225 |
| 6,034,514 A | * | 3/2000 | Sakai | .......................... 323/225 |

* cited by examiner

Primary Examiner—Matthew Nguyen
(74) Attorney, Agent, or Firm—Rosenman & Colin LLP

(57) ABSTRACT

The present invention provides a switching circuit and an electronic switching component having a switching semiconductor device to perform switching between a conducting state and a non-conducting state of a conducting path to thereby reduce the power loss thereof and a control method thereof. In the present invention, at least two FETs 11 and 12, wherein the FET 11 has a faster switching time and the FET 12 has a lower ON resistance. Active terminals (drains and sources) of the FETs 11 and 12 are connected to each other in parallel. By employing these FETs 11 and 12, the conversion between an ON-state and an OFF-state of the conducting path is performed. In converting from the non-conducting state to the conducting state, the control circuit 13 first turns on the FET 11 and then turns on the FET 12 when if a voltage between terminals of the FET 11 reaches around a saturation value thereof. In converting from the conducting state to the non-conducting state, the control circuit 13 first turns off the FET 12 and then turns off the FET 11 when if a voltage between terminals of the FET 11 reaches around a saturation value thereof.

38 Claims, 25 Drawing Sheets

SWITCHING CIRCUIT HAVING A SWITCHING SEMICONDUCTOR DEVICE AND CONTROL METHOD THEREOF

FIELD OF THE INVENTION

The present invention relates to a switching circuit and control method thereof; and more particularly, to a switching circuit and an electronic switching component having a switching semiconductor device to perform switching operation between a conducting state and a non-conducting state of a conducting path and a control method thereof.

BACKGROUND OF HE INVENTION

Conventionally, a DC-to-DC converter is known in the art as a typical circuit in which a switching semiconductor device, e.g., a transistor or a field effect transistor (FET) is employed to have a direct current to flow intermittently, wherein this direct current is smoothed out by using a coil or a condenser to thereby output an output voltage different from a corresponding input voltage. This DC-to-DC converter is usually used in a conversion circuit which converts a voltage inputted thereto from a direct current source to a different voltage.

FIG. 2 shows a conventional DC-to-DC converter circuit 20. The conventional DC-to-DC converter circuit 20 includes a smoothing reaction circuit 22, a switching semiconductor device 23, a smoothing condenser 24, a commutating diode 25, a smoothing condenser 26 and a switching integrated circuit (IC) referred to as a control IC 27.

The switching semiconductor device 23 receives an input voltage Vin from an input terminal 21a and then outputs a corresponding output voltage Vout through the smoothing reaction circuit 22 to an output terminal 21b. The smoothing condenser 24 is connected between the output terminal 21b and a ground. The commutating diode 25 is connected to the circuit at a point between the smoothing reaction circuit 22 and the switching semiconductor device 23; and is connected to the smoothing reaction circuit 22 and the smoothing condenser 24 in parallel, wherein the commutating diode 25 is connected to the smoothing reaction circuit 22 with a polarity to maintain the current of the smoothing reaction circuit 22.

The smoothing condenser 26 is connected between the input terminal 21a and a ground. The control IC 27 monitors the voltage Vout outputted to the output terminal 21b and carries out ON-OFF controlling of the switching semiconductor device 23 to maintain the output voltage Vout at a constant value.

In the DC-to-DC converter circuit 20 as mentioned above, during ON state of the switching semiconductor device 23, Vin inputted to the input terminal 23a is smoothed through the smoothing reaction circuit 22 and the smoothing condenser 24 so that a smoothed voltage is outputted through the output terminal 21b. During OFF state of the switching semiconductor device 23, the current of the smoothing reaction circuit 22 is maintained by the commutating diode 25 in such a way that a constant voltage is outputted through the output terminal 21b. In this case, the control IC 27, in accordance with the change of the output voltage Vout, alters a pulse width of a pulse signal used in controlling ON-OFF operation of the switching semiconductor device 23 to thereby perform a feedback control to maintain the output voltage Vout at a constant value.

But, in general, it takes time to switch between an ON-state and an OFF-state of a switching semiconductor device, e.g., a transistor or a FET. This time is usually referred to as a switching time. A switching loss increases as the switching time becomes longer. For example, during a change between the ON-state and OFF-state of the switching semiconductor 23, e.g., during a time interval between t(1) and t(2) as shown in FIG. 3, there entails a power loss of Vds×Id, wherein Vds and Id are a drain to source voltage and a drain current, respectively.

Further, since there is usually an inverse proportional relationship between a switching speed from ON-state to OFF-state and vice versa and an ON-resistance (saturation resistance) of a switching semiconductor device, e.g., a transistor or a FET, it is impossible to realize both the increase of switching speed and decrease of ON-resistance simultaneously by using only one device. For this reason, in a conventional switching control method, a switching circuit is prepared by compromising between a switching speed and a ON-resistance (saturation resistance) of a switching semiconductor.

SUMMARY OF THE INVENTION

It is, therefore, a primary object of the present invention to provide a switching circuit and an electronic switching component having a switching semiconductor device to perform switching operation between a conducting state and a non-conducting state of a conducting path and a control method thereof.

To achieve the above-mentioned object of the present invention, the relationship between the switching speed (switching time) corresponding to an area of a switching semiconductor device and an ON-resistance (saturation voltage) thereof is employed to reduce the power loss thereof. For example, the ON-resistance may be an ON-resistance of a field effect transistor (FET) or an equivalent resistance corresponding to a saturation voltage of a transistor.

There is usually an inverse proportional relationship between a switching speed and an ON-resistance (saturation resistance) of a switching semiconductor device, e.g., a transistor or a FET. Namely, as the chip area of a switching semiconductor device increases, the ON-resistance (saturation voltage) decreases. Further, as the chip area of a switching semiconductor device increases, the capacitance thereof increases. Then the input/output signal wave becomes dull to thereby reduce the switching speed.

In accordance with one aspect of the present invention, there is provided, by employing the relationship between the switching speed and the magnitude of the ON-resistance (saturation voltage), a switching control method for connecting switching semiconductor devices to a conducting path and switching between a conducting state and a non-conducting state of the conducting path, the method comprising the steps of: (a) connecting active terminals of two or more switching semiconductor devices in parallel; and (b) switching between a conducting state and a non-conducting state of the conducting path by employing the two or more switching semiconductor devices.

In accordance with another aspect of the present invention, there is provided a switching circuit having switching semiconductor devices connected between an input terminal and an output terminal thereof for switching between a conducting state and a non-conducting state of a conducting path between the input terminal and the outout terminal thereof in response to a control signal inputted thereto from outside, the switching circuit comprises: two or more switching semiconductor devices connected in parallel to each other between the input terminal and the output terminal thereof; and a control circuit for controlling converting between conducting states and non-conducting states of the two or more switching semiconductor devices.

In accordance with yet another aspect of the present invention, there is provided an electronic switching component comprising: a package; two input/output outer terminals exposed from the package; two or more switching semiconductor devices formed in the package connected in parallel between the two input/output outer terminals, wherein at least one of the two or more switching semiconductor devices has switching property different from those of the outer switching semiconductor devices; and one or more outer control terminals connected to each of the switching semiconductor devices, wherein the one or more outer control terminals are exposed from the package.

In accordance with still another aspect of the present invention, there is provided an electronic switching control component for inputting an ON/OFF control signal and then outputting two or more device control signals for use in controlling two or more semiconductor devices in response to the ON/OFF control signal, the component comprising:

a package; a control signal input terminal exposed from the package for inputting the ON/OFF control signal; two or more device control signal output terminals exposed from the package for outputting the two or more device control signals; and a control circuit formed in the package, wherein the control circuit includes a circuit for outputting a device control signal to convert from an OFF state to an ON state to a device control signal output terminal in response to the ON/OFF control signal and then after a predetermined time period, outputting a device control signal to convert from an ON state to an OFF state to a device control signal output terminal.

BRIEF DESCRIPTION OF THE DRAWINGS

The above and other objects and features of the present invention will become apparent from the following description of preferred embodiments given with reference to the accompanying drawings in which.

DETAILED DESCRIPTION OF THE PREFERRED EMBODIMENTS

From now on, by referring to the Figures mentioned above, preferred embodiments of the present invention will be described in detail.

Figure 1:
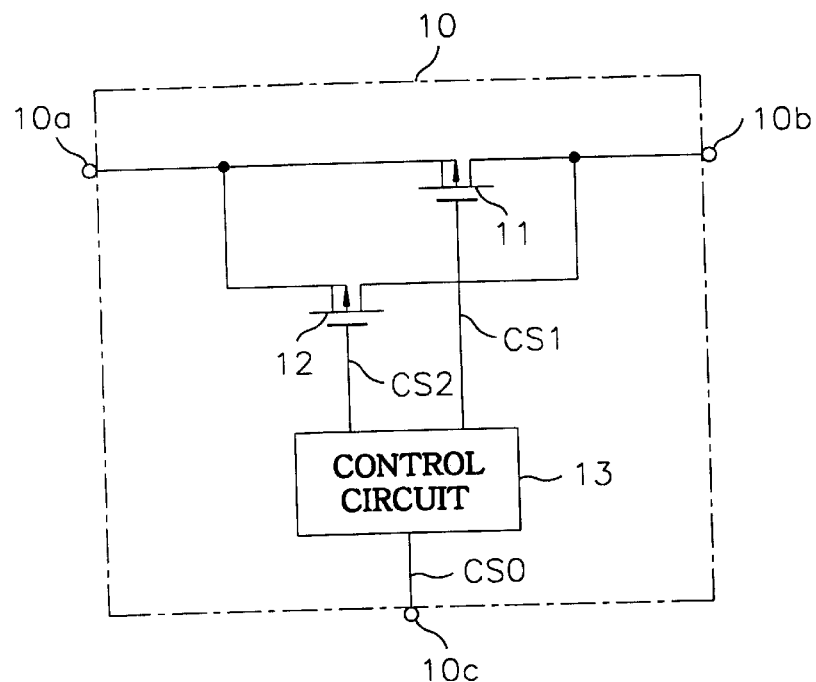
FIG. 1 represents a switching circuit in accordance with a first preferred embodiment of the present invention.

FIG. 1 represents a switching circuit 10 in accordance with a first preferred embodiment of the present invention. In FIG. 1, the switching circuit 10 comprises a control circuit 13 and P-channel field effect transistors (FETs) 11 and 12. A switching time between ON-state and an OFF-state of the FET 11 is shorter than that of the FET 12. Further, an ON-resistance of the FET 12 is lower than that of the FE, 11.

In FIG. 1, both sources of the FETs 11 and 12 are connected to an input terminal 10a; and both of drains of the FETs 11 and 12 are connected to an output terminal 10b. Both gates of the FETs 11 and 12 are connected to the control circuit 13. The control circuit 13, in accordance with On/OFF control signal CS(0) inputted thereto from outside, issues device control signals CS(1) and CS(2) to alter ON/OFF states of the FETs 11 and 12 to thereby output the device control signals CS(1) and CS(2) to the gates of the FETs 11 and 12, respectively.

Figure 4:
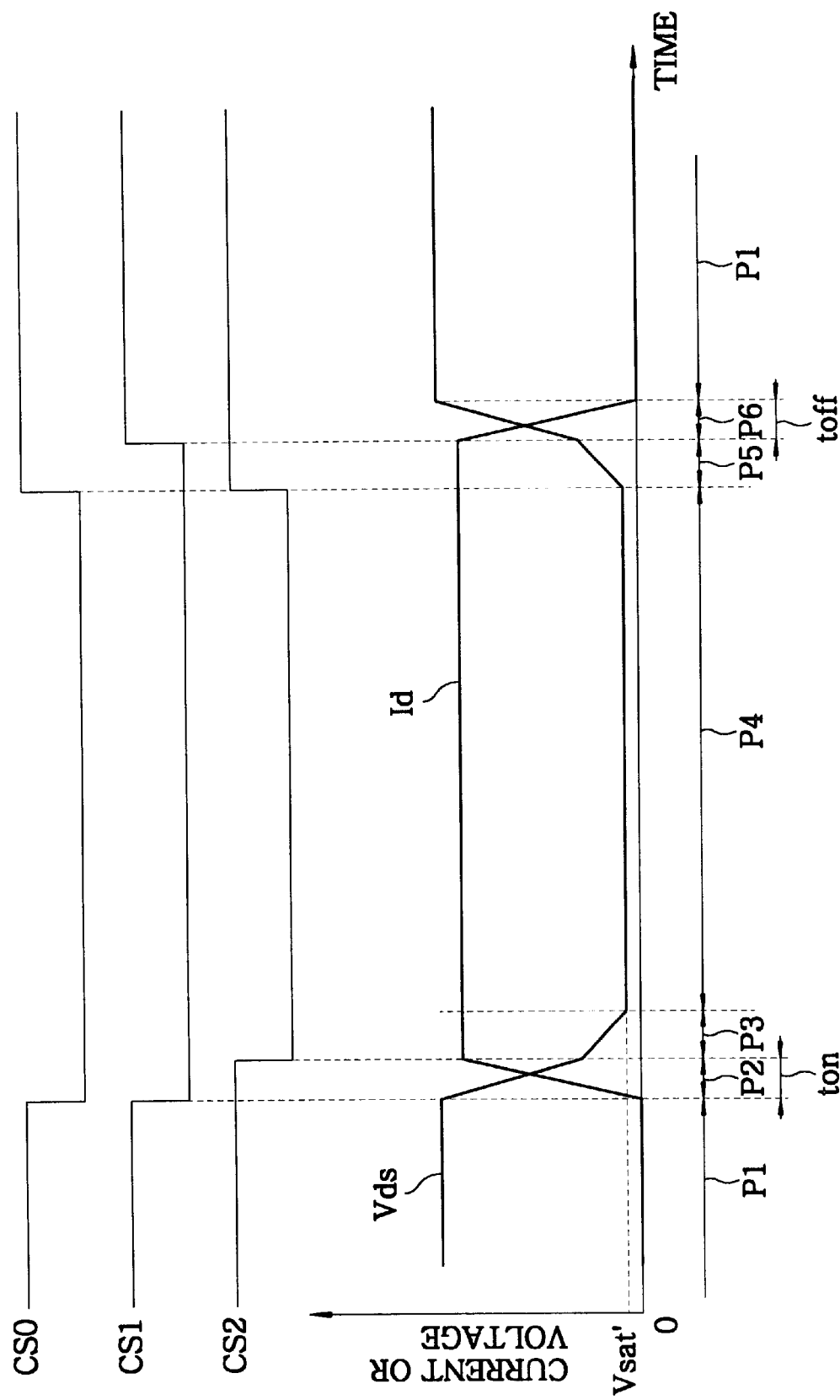
FIG. 4 presents a timing diagram to describe a switching operation in accordance with the first preferred embodiment of the present invention.

The operation of the switching circuit 10 will be described. In the switching circuit 10, a conducting path is formed between the input terminal 10a and the outout terminal 10b; the switching circuit 10 performs switching between a conducting state and a non-conducting state of the conducting path by altering ON/OFF states of the FETs 11 and 12. In this case, a current flows through the conducting path when the FETs are turned on. FIG. 4 presents a timing diagram to describe a switching operation in accordance with the first preferred embodiment of the present invention.

For example, the device control signals CS(1) and CS(2) generated at the control circuit 13 are preferably, e.g., signals shown in FIG. 4. Namely, when the ON/OFF control signal CS(0) changes from a high level (period P1) indicating the OFF state to a low level (periods P2 to P4) indicating the ON state, the device control signal CS(1) for the FET 11 changes from a high level to a low level and the FET 11 having a higher switching speed is set as ON-state.

In this case, a potential difference (i.e., a drain to source voltage Vds of the FET11) between the input terminal 10a and the output terminal 10b rapidly reduces as the switching time goes on and a current Id (a drain current or the FET 11) rapidly starts to flow between the input terminal 10a and the output terminal 10b (i.e., during interval P2). Thereafter, when the potential difference between the input terminal 10a and the output terminal 10b approaches to a saturation voltage corresponding to an ON-resistance of the FET 11, the device control signal CS(2) for the FET 12 is converted from high level into low level to thereby set the FET 12 ON-state. A current between the input terminal 10a and the output terminal 10b flows through both the FET 11 and the FET 12; and an ON-resistance of FET 11 and an ON-resistance of FET 12 are connected in parallel.

In this case, the potential difference between the input terminal 10a and the output terminal 10b, i.e., a drain to source voltage Vds of the FETs 11 and 12 decreases in accordance with the switching speed of the FET 12 (during the period P3); and accordingly remains at a saturation voltage Vsat' corresponding to the equivalent resistance of the FETs 11 and 12 (during the period P4).

As a result, a turn-on time interval $t_{on}$ (switching time interval of the FEET 11) in the conducting state of the corresponding conducting path is shortened and accordingly the power loss during the turn-on time interval $t_{on}$ is also reduced.

Meanwhile, when the ON/OFF control signal CS(0) changes from a low level (periods P2 to P4) indicating the ON state to a high level (periods P5, P6, P1) indicating the OFF state, the device control signal CS(2) for the FET 12 changes from a low level to a high level and the FET 12 is set as OFF-state.

In this case, the potential difference (i.e., a drain to source voltage Vds of the FETs 11 and 12) between the input terminal 10a and the output terminal 10b increases as the switching time goes on (period P5). Thereafter, when a potential difference between the input terminal 10a and the output terminal 10b approaches to a saturation voltage corresponding to an ON-resistance of the FET 11, the device control signal CS(1) for the FET 11 is converted from a low level into a high level to thereby set the FET 11 as OFF-state.

Accordingly, a current between the input terminal 10a and the output terminal 10b rapidly decreases as the switching time of the FET 11 goes on; on the other hand, the potential difference between the input terminal 10a and the output terminal 10b rapidly increases (period P6); and eventually, the current does not flow between the input terminal 10a and the output terminal 10b any more to thereby render the conducting path thereof to be a non-conducting state (period P1).

In view of the foregoing, since the saturation voltage Vsat' can be reduced during the conducting state of the conducting path (periods P3 to P5), a power loss due to an ON-resistance of FETs 11 and 12 also decreases. As a result, a turn-off time interval $t_{off}$ (switching time interval of the FEET 11) in the non-conducting state of the corresponding conducting path is shortened and accordingly the power loss during the turn-off time interval $t_{off}$ is also reduced.

If, instead of FET 12, another FET which has lower ON-resistance than the FET 12 is used, an equivalent resistance in the conducting state of the conducting path is reduced to thereby further decrease the power loss in the conducting state. An appropriate selection of the properties of the FETs 11 and 12 can alter either only the switching time interval or only the saturation voltage of the input and output terminals 10a and 10b. It is apparent that if, instead of FET 12, active terminals (source and drains) of FETs are connected in parallel, an equivalent resistance in the conducting state of the conducting path is reduced to thereby further decrease the power loss in the conducting state.

If the FETs 11 and 12 are alternately turned on at an initial state, when turning from OFF-state to ON-state in the switching circuit, a stress applied to the FET can be dispersed to the FETs 11 and 12. When active terminals of three or more FETs connected in parallel are used, a stress applied to the FET can be dispersed by alternating the FET which is initially turned on in sequence.

In the first preferred embodiment of the present invention, FETs 11 and 12 which have different switching speed and ON-resistance from each other are used, but FETs having almost same switching speed and ON-resistance may also be used. Further, since the time interval needed to change the non-conducting state to the conducting state depends on the FET 11 which has faster switching speed than the FET 12, setting the two FETs 11 and 12 as ON-states can also entail the same effect. It should be noted that in the first embodiment, an FET is used as a switching semiconductor device, but a transistor or another semiconductor device can be used to obtain the same effect.

Figure 5:
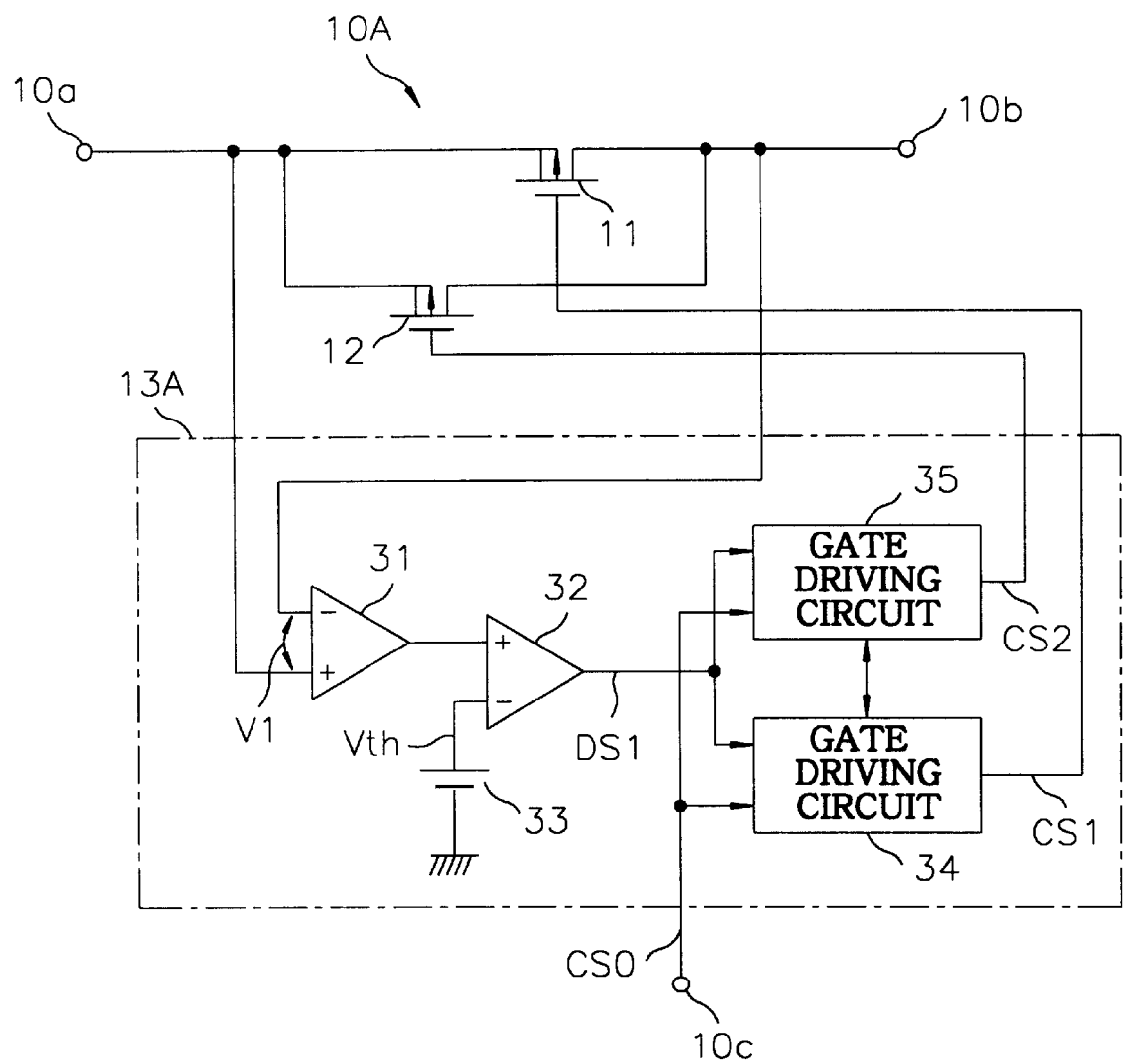
FIG. 5 sets forth a switching circuit in accordance with a second preferred embodiment of the present invention.

Next, a second preferred embodiment of the present invention is described. FIG. 5 sets forth a switching circuit 10A in accordance with a second preferred embodiment of the present invention. In FIG. 5, same reference numerals as those of FIG. 4 represent same devices or components; and therefore, the detailed description thereof is omitted. In the second preferred embodiment, a control circuit 13A is used instead of the control circuit 13 of FIG. 1. The control circuit 13A comprises a differential amplifier 31, a comparator 32, a reference voltage generator 33 and gate driving circuits 34 and 35.

Two input terminals of the differential amplifier 31 are tied to the input and output terminals 10a and 10b, respectively. The differential amplifier 31 outputs a voltage corresponding to a potential difference V1 between the input terminal 10a and the output terminal 10b. The outputted voltage from the differential amplifier 31 is inputted to a non-inverting input terminal of the comparator 32; and a reference voltage Vth from the reference voltage generator 33 is applied to an inverting input terminal of the comparator 32.

The reference voltage Vth has been set as a saturation voltage corresponding to the ON-resistance of the FET 11. Accordingly, an output signal DS(1) of the comparator 32 becomes high level if the potential difference V(1) between the input and output terminals 10a and 10b is equal to or greater than the Vth; and becomes low level if the V(1) is less than the Vth.

Each of the DS(1) from the comparator 32 and the ON/OFF control signal CS(0) are fed to the gate driving circuits 34 and 35. In response to the DS(1) and the CS(0), the gate driving circuits 34 and 35 generate a device control signals CS(1) and CS(2), respectively.

After the FET 11 is set as ON-state, the FET 12 can be set as ON-state when the potential difference V(1) between the input terminal 10a and output terminal 10b reaches the saturation voltage corresponding to the ON-resistance of the FET 11. Further, after the FET 12 is set as OFF-state, the FET 11 can be set as OFF state when the potential difference V(1) between the input terminal 10a and output terminal 10b reaches the saturation voltage corresponding to the ON-resistance of the FET 11.

Figure 6:
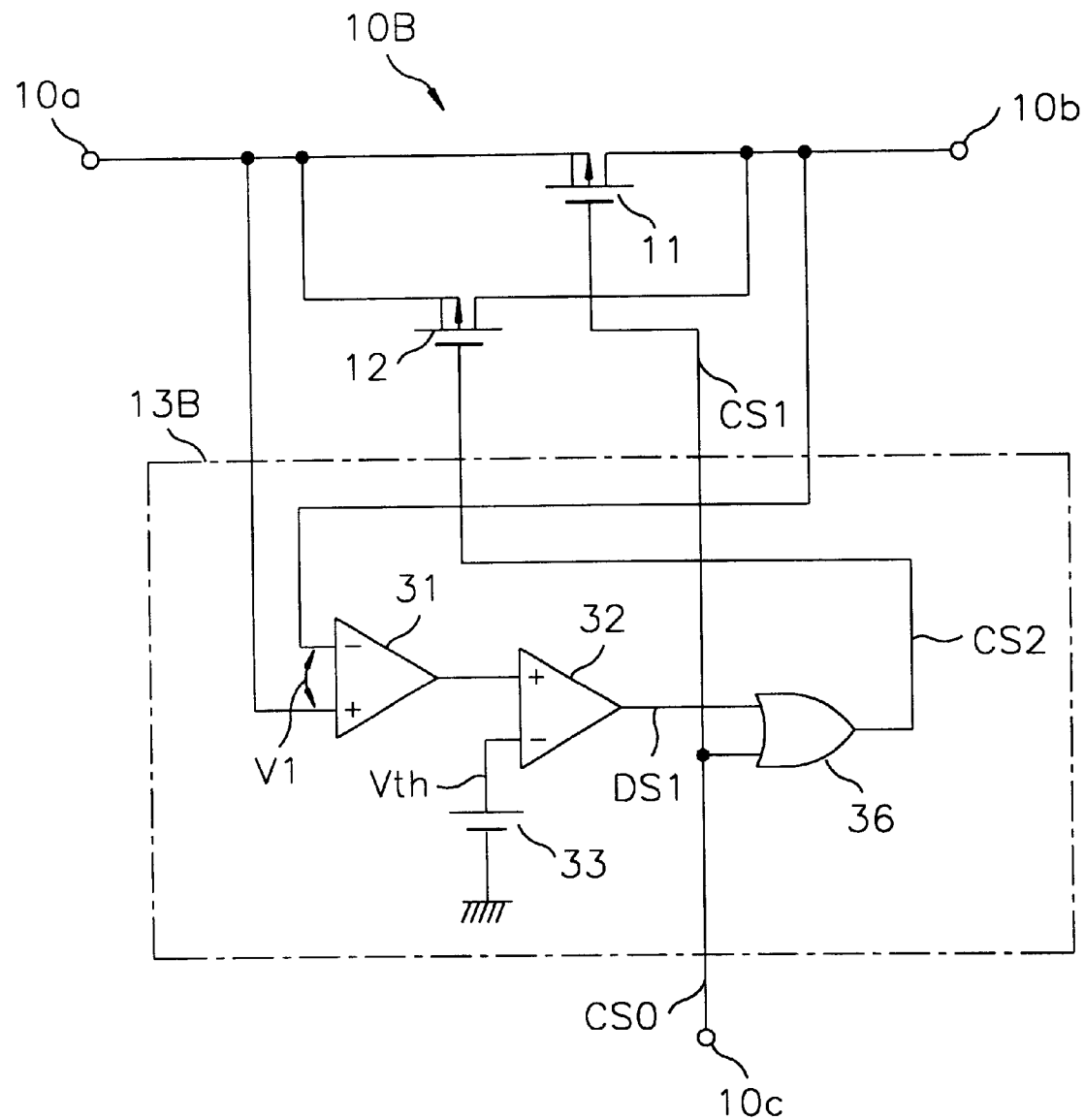
FIG. 6 represents a switching circuit in accordance with a third preferred embodiment of the present invention.

A third preferred embodiment of the present invention will be described. FIG. 6 represents a switching circuit 10B in accordance with the third preferred embodiment of the present invention. In FIG. 6, same reference numerals as those in the second embodiment represent same devices or components; and therefore, the detailed description thereof is omitted. The third preferred embodiment of the present invention is different from the second embodiment in view of having a two-input logic circuit (referred to as OR circuit) 36 instead of the gate driving circuits 34 and 35.

In the switching circuit 10B, one input terminal of the OR circuit 36 is connected to the output terminal of the comparator 32; and the other input terminal of the OR circuit 36 is connected to a control signal input terminal 10C and the gate of the FET 11. The output terminal of the OR circuit 36 is connected to the gate of the FET 12.

Figure 7:
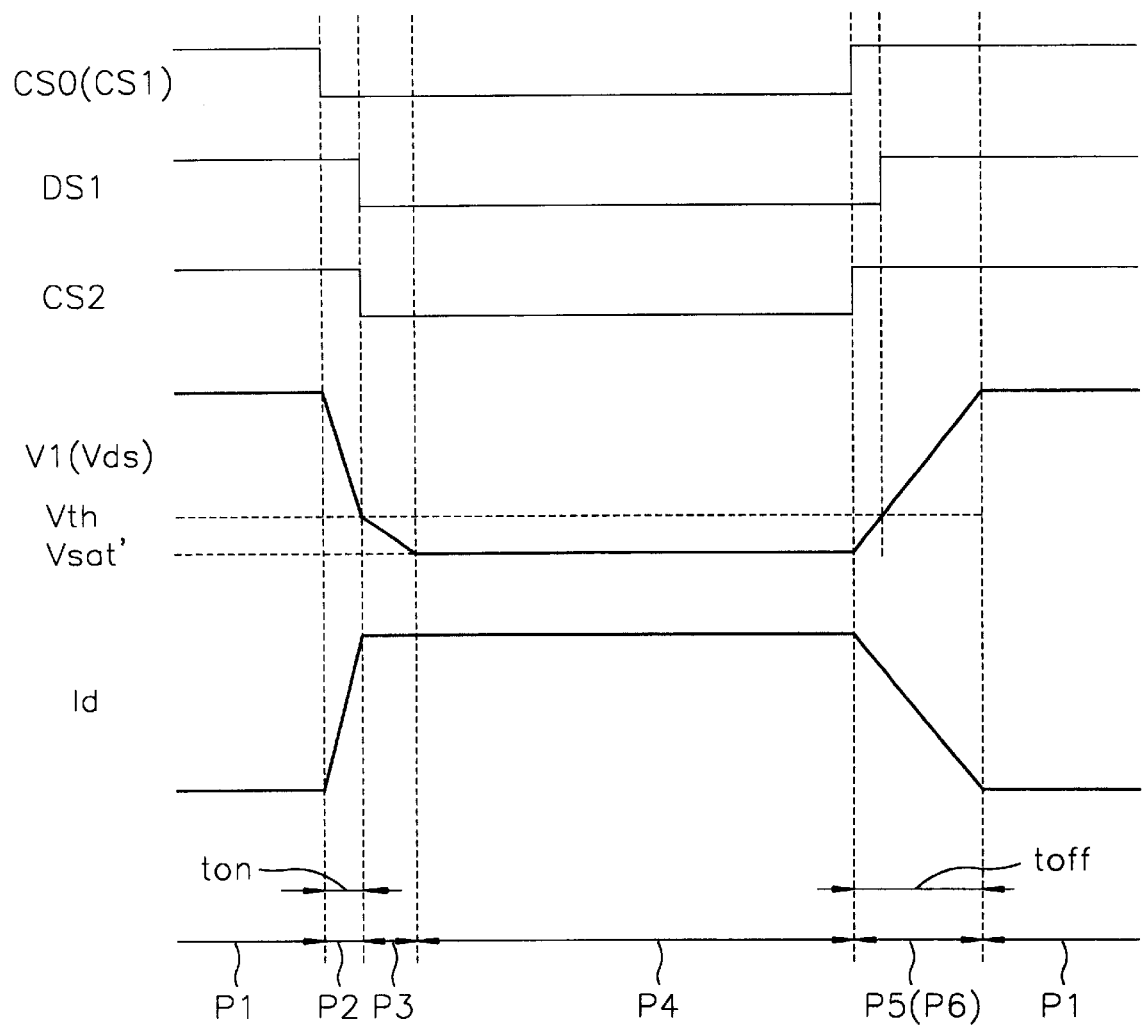
FIG. 7 shows a timing diagram to describe a switching operation in accordance with the third preferred embodiment of the present invention.

FIG. 7 shows a timing diagram to describe a switching operation in accordance with the third preferred embodiment of the present invention. As shown in FIG. 7, the device control signal CS(1) for the FET 11 is the same as the ON/OFF control signal CS(0); the falling time from a high level to a low level of the device control signal CS(2) for the FET 12 is the same as that of the DS(1); and the rising time from a low level to a high level of the device control signal CS(2) for the FET 12 is the same as that of the CS(0)

Therefore, a turn-on time interval for changing from a non-conducting state to a conducting state thereof is shortened; a power loss during the turn-on time interval is reduced; and a power loss corresponding to the ON-resistance of the conducting state is decreased. But, in this case, since both the FET 11 and the FET 12 are set as OFF states, a corresponding turn-off time interval will be a sum of a period P5 and a period P6 as shown in FIG. 7, and the shortening of the turn-off time interval and reduction of the power loss thereof are not satisfactory.

Figure 8:
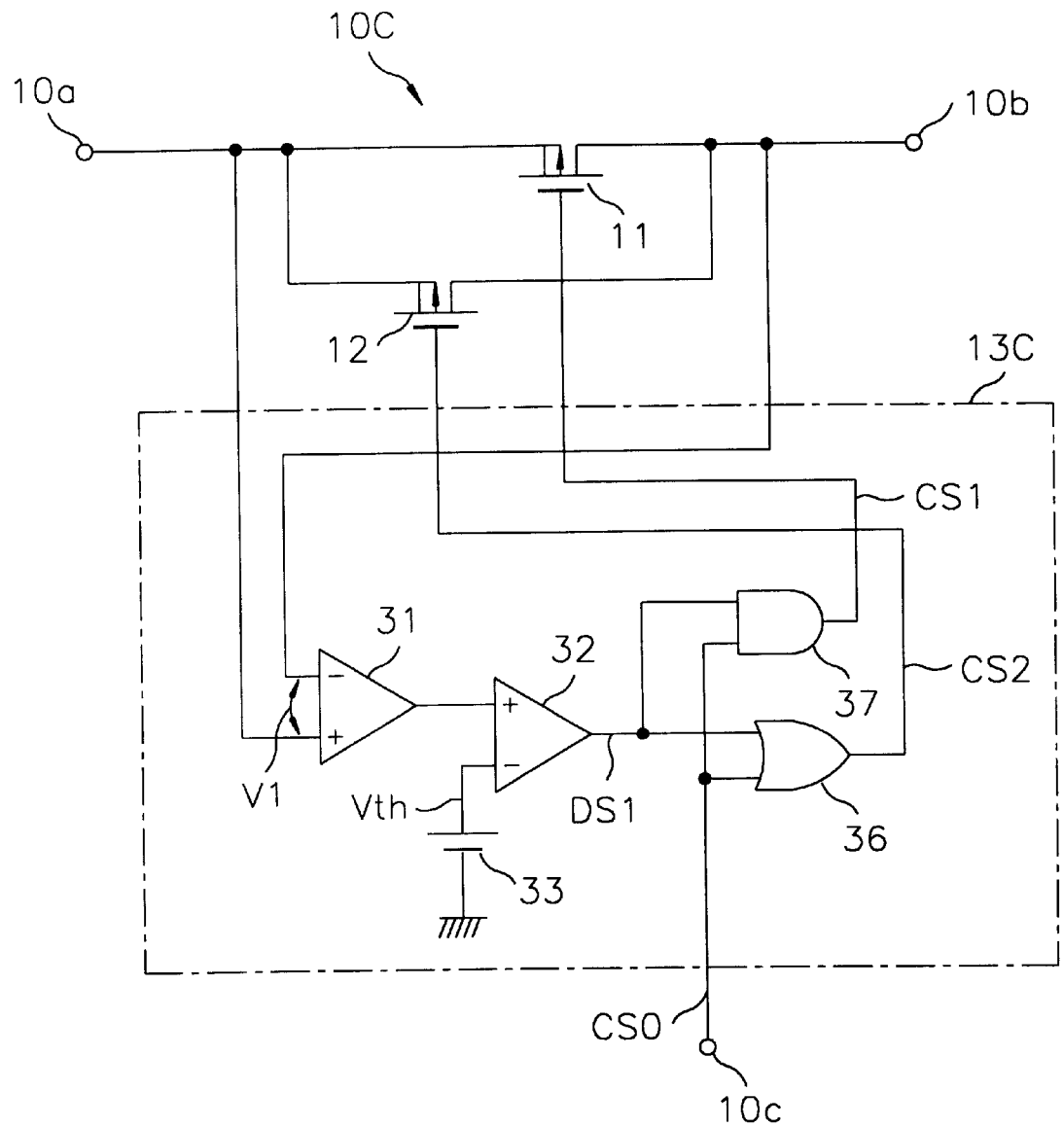
FIG. 8 sets forth a switching circuit in accordance with a fourth preferred embodiment of the present invention.

FIG. 8 sets forth a switching circuit 10C to achieve the shortening of the turn-off time interval and reduction of the power loss in accordance with a fourth preferred embodiment of the present invention. In FIG. 8, same reference numerals as those in the third embodiment represent same devices or components; and therefore, the detailed description thereof is omitted. The fourth preferred embodiment of the present invention is different from the third embodiment in view of having a control circuit 13C instead of the control circuit 13B. In comparison with the switching circuit 13B, the switching circuit 13C further comprises a two-input AND circuit 37.

Figure 9:
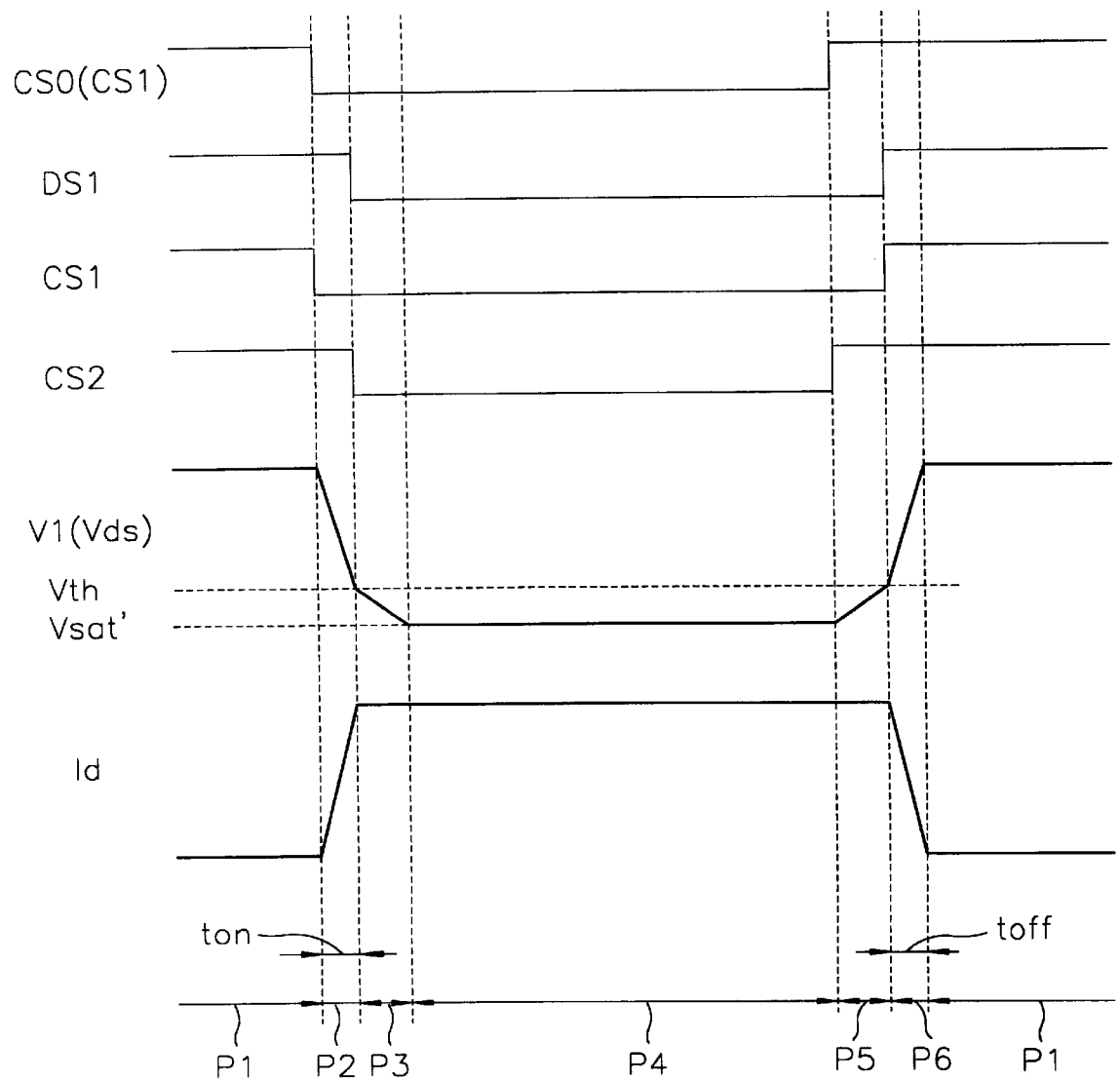
FIG. 9 presents a timing diagram to describe a switching operation in accordance with the fourth preferred embodiment of the present invention.

In the AND circuit 37, the ON/OFF signal is inputted to one input terminal of the AND circuit 37; and the output DS(1) of the comparator 32 is fed to the other input terminal of the AND circuit 37. The output signal of the AND circuit 37 is fed as a device control signal for the FET 12 to the gate of the FET 12. FIG. 9 presents a timing diagram to describe a switching operation in accordance with the fourth preferred embodiment of the present invention. The control circuit 13C can generate a device control signal CS(1) as shown in FIG. 9, thereby enabling a preferable ON/OFF switching operation with high efficiency as described in the second embodiment.

Therefore, by employing the switching circuit 10C, a turn-on time interval $t_{on}$ and a turn-off time interval $t_{off}$ are shortened; power losses during the turn-on time interval and the turn-off time interval are reduced; and a power loss corresponding to the ON-resistance of the conducting state is decreased.

Figure 2:
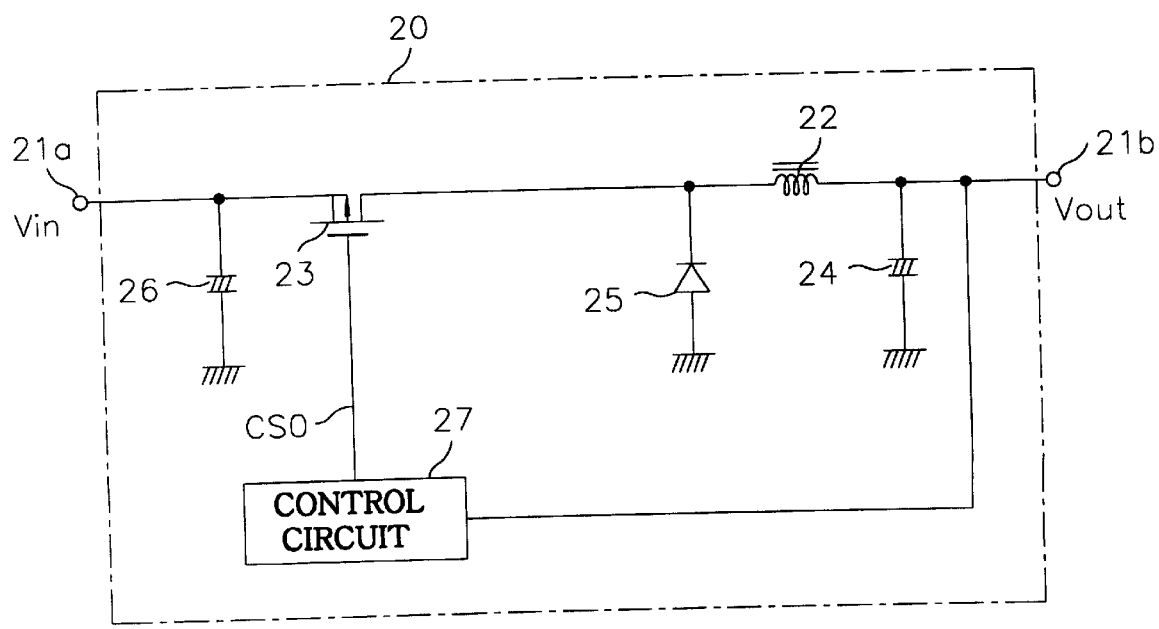
FIG. 2 shows a conventional DC-to-DC converter circuit.
Figure 3:
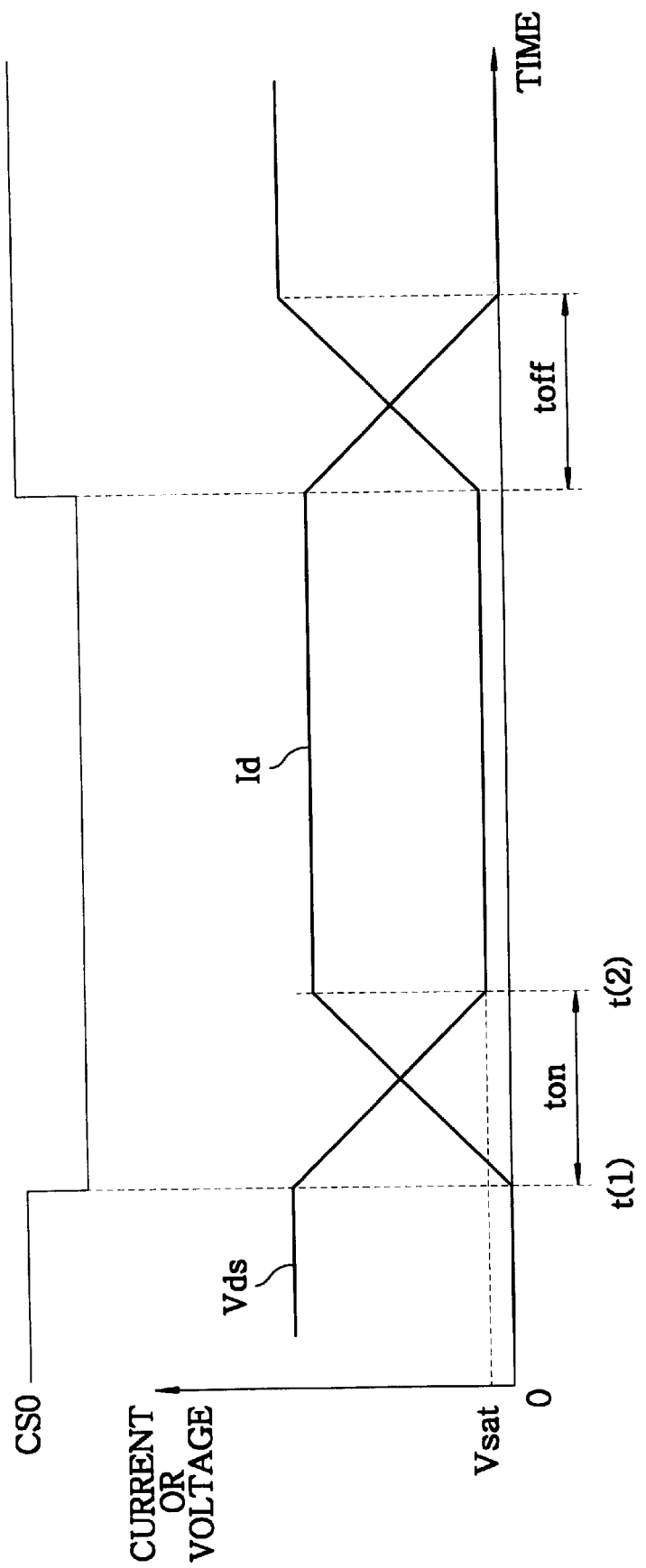
FIG. 3 depicts a timing diagram to describe a switching operation of the conventional DC-to-DC converter circuit.
Figure 10:
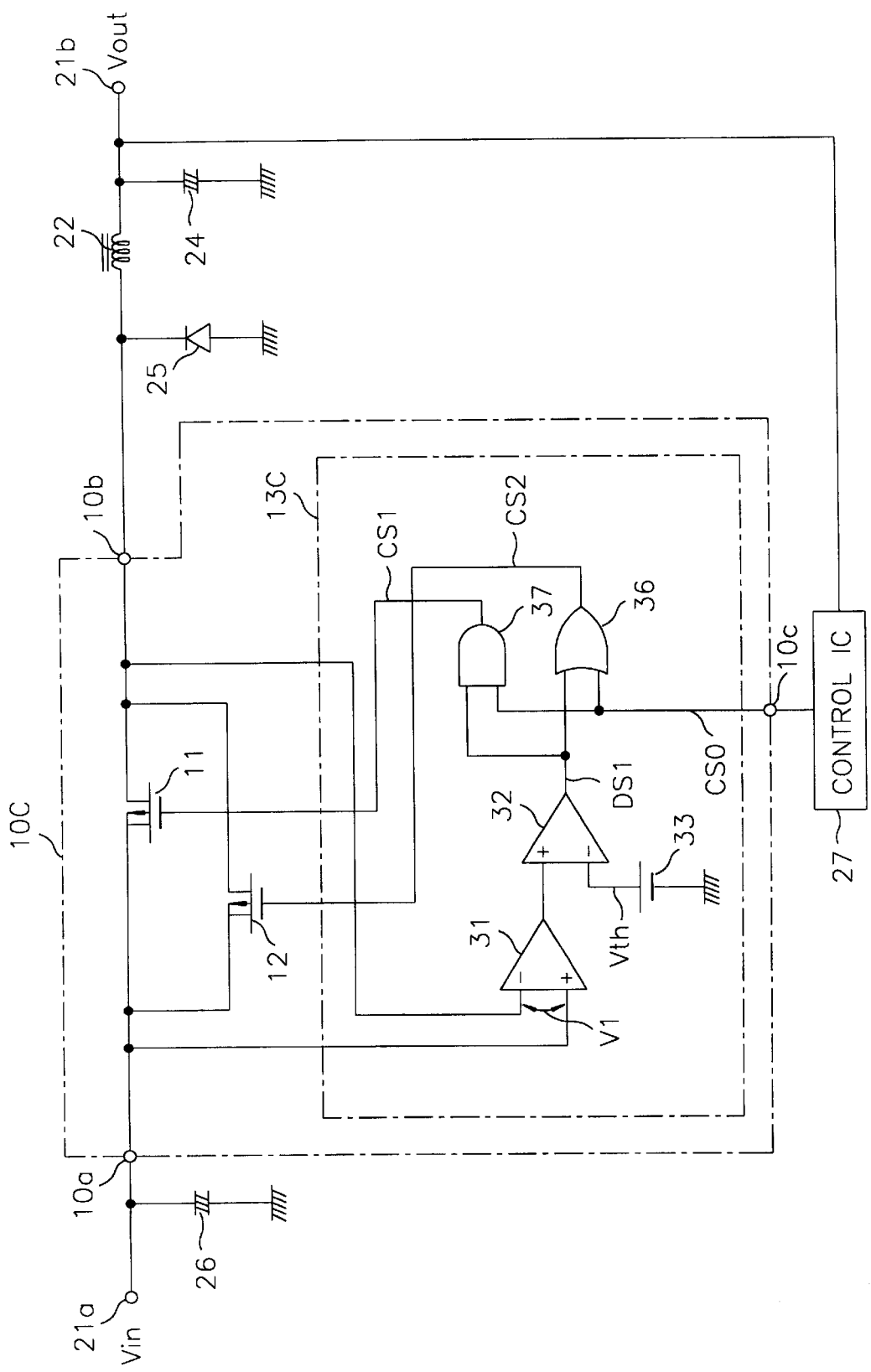
FIG. 10 depicts a DC-to-DC converter circuit having the switching circuit of the fourth embodiment in accordance with a fifth preferred embodiment of the present invention.

FIG. 10 depicts a DC-to-DC converter circuit having the switching circuit 10C of the fourth embodiment in accordance with a fifth preferred embodiment of the present invention. As depicted in FIG. 10, the fifth preferred embodiment of the present invention is different from the fourth embodiment in view of having a switching circuit 10C instead of the switching conductor circuit 23 in FIG. 2 representing a prior art. In this case, an ON/OFF control signal CS(0) is generated by the control IC 27. This DC-to-DC converter of FIG. 10 shortens the switching time interval and reduces the power loss thereof in comparison of the prior art DC-to-DC converter 20 shown in FIG. 2.

Figure 11:
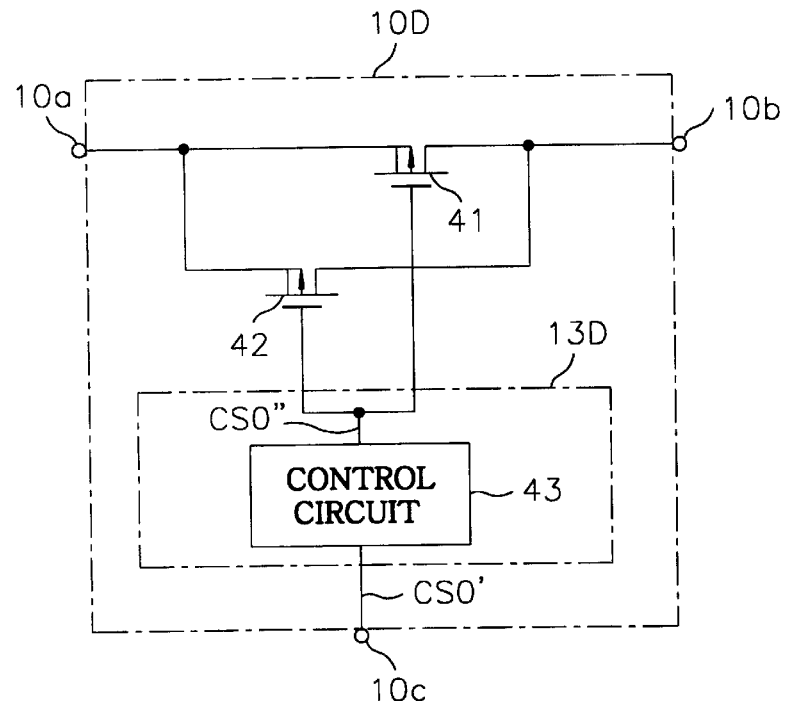
FIG. 11 represents a switching circuit in accordance with a sixth preferred embodiment of the present invention.

Next, a sixth preferred embodiment of the present invention is described. FIG. 11 represents a switching circuit 10D in accordance with the sixth preferred embodiment of the present invention. In FIG. 11, N-channel type FETs 41 and 42 have short switching time intervals. Threshold voltage levels relating to the turn-on/turn-off operation of the FET 41 are different from those of the FET 42, respectively. In this case, threshold voltage levels of the FETs 41 and 42 are set as Vth(1) and Vth(2), respectively, wherein Vth(2)>Vth(1). Further, a control circuit 13D includes a trapezoid wave generating circuit 43.

Figure 12:
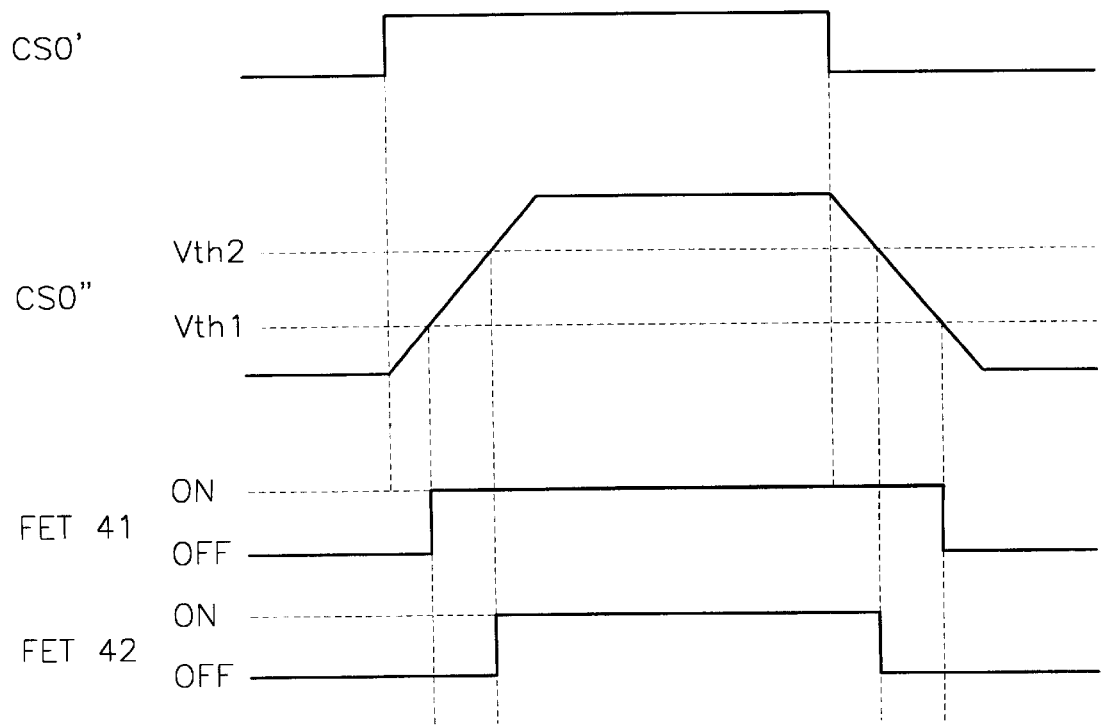
FIG. 12 shows a timing diagram to describe a switching operation in accordance with the sixth preferred embodiment of the present invention.

Since, the N-channel type FFTs 41 and 42 become OFF-state and ON-state when the gate voltage levels thereof are a low level and a high level, respectively, the FETs 41 and 42 use an inverted signal of the ON/OFF control signal CS(0) as an ON/OFF control signal CS(0'). FIG. 12 shows a timing diagram to describe a switching operation in accordance with the sixth preferred embodiment of the present invention. The trapezoid wave generating circuit 43, based on the ON/OFF control signal CS(0'), outputs a device control signal CS(0") of a trapezoid shape as shown in FIG. 12.

The voltage of the device control signal CS(0") slowly increases linearly as the ON/OFF control signal CS(0') changes from the low level to the high level; and slowly decreases linearly as the ON/OFF control signal CS(0') changes from the high level to the low level. The threshold voltage levels Vth(1) of FET 41 and Vth(2) of FET 42 are set to have respective intermediate values between the maximum value and the minimum value of the device control signal CS(0").

As shown in FIG. 12, the voltage level of the device control signal CS(0") starts to increase when the ON/OFF control signal CS(0') changes from the low level into the high level and when it reaches the first threshold voltage level Vth(1), the FET 41 becomes ON-state. Thereafter, when the voltage level of the device control signal CS(0") further increases to thereby reach the second threshold voltage level Vth(2), the FET 42 becomes ON-state. Further, the voltage level of the device control signal CS(0") starts to decrease when the ON/OFF control signal CS(0') changes from the high level into the low level and when it drops to the second threshold voltage level Vth(2), FET 42 becomes OFF-state. When the voltage level of the device control signal CS(0") further decreases to thereby reach the first threshold voltage level Vth(1), the FET 41 becomes OFF-state. Accordingly, the operation of the FETs 41 and 42 described above can decrease the power loss during the turn-on time interval and the turn-off time interval; reduces a power loss due to the ON-resistance of the conducting state thereof.

It is preferable that the increasing and decreasing gradient of the trapezoid wave generated by the trapezoid wave generating circuit 43 are set as optimum values corresponding to the switching time intervals, saturation voltages and threshold voltage levels Vth(1) and Vth(2) of the FETs 41 and 42, respectively.

Figure 13:
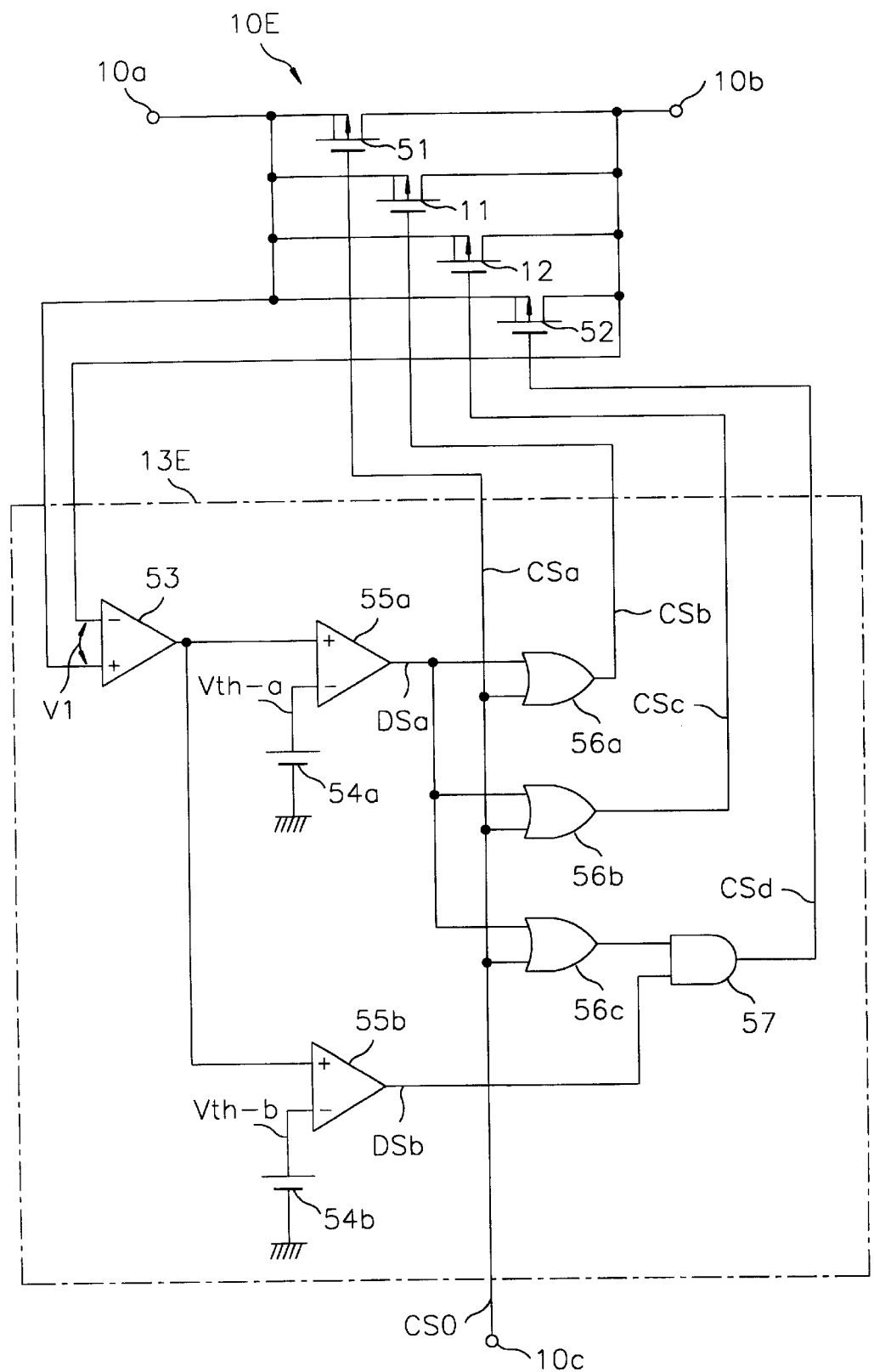
FIG. 13 sets forth a switching circuit in accordance with a seventh preferred embodiment of the present invention.

Next, a seventh preferred embodiment of the present invention will be described. FIG. 13 sets forth a switching circuit 10E in accordance with the seventh preferred embodiment of the present invention. FETs 11 and 12 are the same as the FETs 41 and 42, respectively, which have short switching time intervals and high ON-resistances. The turn-on switching time interval of a FET 51 is shorter than that of each of the FETs 41 and 42; and the turn-off switching time interval of the FET 51 is longer than that of each of the FETs 41 and 42. The turn-off switching time interval of a FET 52 is shorter than that of each of the FETs 41 and 42; and the turn-on switching time interval of the FET 52 is longer than that of each of the FETs 41 and 42. In this case, there is an inverse proportional relationship between the switching speed and ON-resistance of the FET as described in the above.

FETs 11, 12, 51 and 52 are connected to each other in parallel. The source and drain of each of the FETs 11, 12, 51 and 52 are connected to input terminal 10a and output terminal 10b, respectively. A control circuit 13E comprises a differential amplifier 53, comparators 55a and 55b, reference voltage generation circuits 54a and 54b, OR circuits 56a to 56c and an AND circuit 57. Two input terminals of the differential amplifier 53 are coupled to the input terminal 10a and output terminal 10b. The differential amplifier 53 outputs a potential difference V(1) between the input terminal 10a and output terminal 10b.

The output voltage from the differential amplifier 53 is fed to a non-inverting input terminal of the comparator 55a. A first reference voltage Vth-a from the reference voltage generation circuit 54a is applied to an inverting input terminal of the comparator 55a. In this case, a saturation voltage corresponding to the ON-resistance of the FET 51 is set as the first reference voltage Vth-a.

Accordingly, an output signal Dsa of the comparator 55a becomes a high level or a low level depending on whether V(1) is equal to or greater than Vth-a or less than Vth-a, respectively, wherein V(1) is a potential difference between the input terminal 10a and output terminal 10b.

The output voltage from the differential amplifier 53 is fed to a non-inverting input terminal of the comparator 55b. A second reference voltage Vth-b from the reference voltage generation circuit 54b is applied to an inverting input terminal of the comparator 55b. In this case, a saturation voltage corresponding to the ON-resistance of the FET 52 is set as the second reference voltage Vth-b.

Accordingly, an output signal DSb of the comparator 55b becomes a high level or a low level depending on whether the V(1) is equal to or greater than Vth-b or less than Vth-b, respectively.

The output signal DSa from the comparator 55a and the ON/OFF control signal CS(0) are inputted to an OR circuit 56a. The OR circuit 56a performs logic OR operation on the DSa and CS(0) to thereby provide a device control signal CSb for the FET 11 to the gate of the FET 11.

The output signal DSa from the comparator 55a and the ON/OFF control signal CS(0) are inputted to an OR circuit 56b. The OR circuit 56b performs logic OR operation on the DSa and CS(0) to thereby provide a device control signal CSc for the FET 12 to the gate of the FET 12.

The output signal DSa from the comparator 55a and the ON/OFF control signal CS(0) are also inputted to an OR circuit 56c. The OR circuit 56c performs logic OR operation on the DSa and CS(0) to thereby provide a logic OR operated signal.

The output signal DSa from the OR circuit 56c and the output signal DSb of the comparator 55b are also inputted to an AND circuit 57. The AND circuit 57 performs logic AND operation on the DSa and CS(0) to thereby provide a logic AND operated signal as a device control signal for the FET 52 to the gate of the FET 52. The ON/OFF control signal CS(0) is fed as a device control signal for the FET 51 to the gate of the FET 51.

Figure 14:
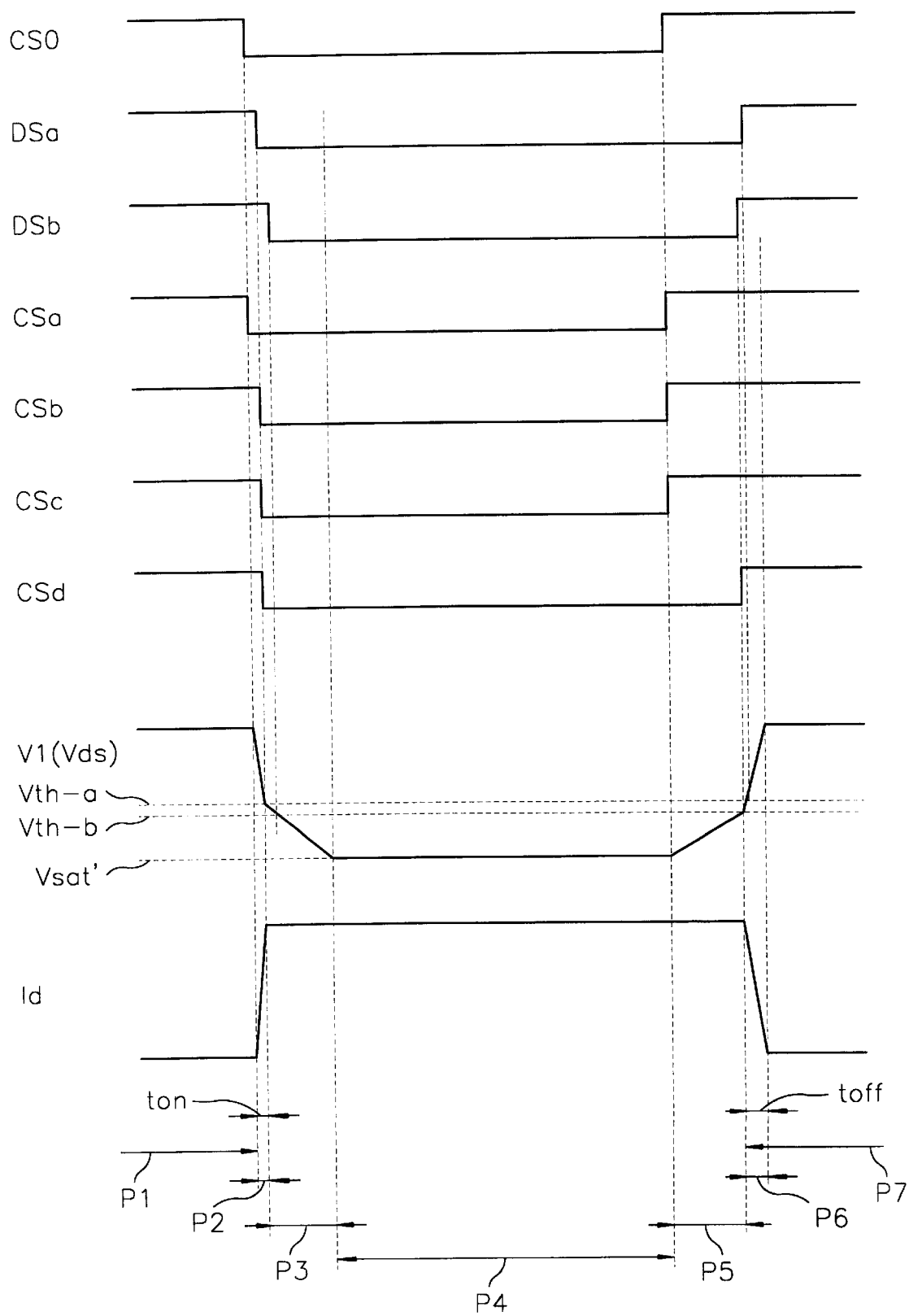
FIG. 14 presents a timing diagram to describe a switching operation in accordance with the seventh preferred embodiment of the present invention.

FIG. 14 presents a timing diagram to describe a switching operation of a switching circuit 10E in accordance with the seventh preferred embodiment of the present invention. In the switching circuit 10E, a conducting path is formed between the input terminal 10a and the output terminal 10b; the switching circuit 10E performs switching between a conducting state and a non-conducting state of the conducting path by altering ON/OFF states of the FETs 11, 12, 51 and 52. In this case, a current flows through the conducting path when the FETs are turned on.

When the ON/OFF control signal CS(0) changes from a high level (period P1) indicating the OFF state to a low level (periods P2 to P4) indicating the ON state, the device control signal CSa for the FET 51 changes from a high level to a low level and the FET 51 is set as ON-state.

In this case, a potential difference (i.e., a drain to source voltage Vds of the FET 51) between the input terminal 10a and the output terminal 10b rapidly reduces as the switching time goes on and a current Id (a drain current of the FET 51) rapidly starts to flow between the input terminal 10a and the output terminal 10b (i.e., during interval P2). Thereafter, when the potential difference between the input terminal 10a and the output terminal 10b reaches to a saturation voltage corresponding to an ON-resistance of the FET 51, the device control signals CSb, CSc, CSd for the FETs 11, 12 and 52 are shifted from high levels into low levels to thereby set the FETs 11, 12 and 52 ON-states, respectively.

A current between the input terminal 10a and the output terminal 10b flows through the FETs 51, 11, 12 and 52; and ON-resistances of the FETs 51, 11, 12 and 52 are connected in parallel. In this case, the potential difference V(1) between the input terminal 10a and the output terminal 10b decreases in accordance with the switching speed of the FETs 11, 12, 52 (during the period P3); and accordingly remains at a saturation voltage Vsat' corresponding to the equivalent resistance of the FETs 51, 11, 12 and 52 (during the period P4).

As a result, a turn-on time interval $t_{on}$ (switching time interval of the FEET 51) in the conducting state of the corresponding conducting path is shortened and accordingly the power loss during the turn-on time interval $t_{on}$ is also reduced.

Meanwhile, when the ON/OFF control signal CS(0) changes from a low level (periods P2 to P4) indicating the ON state to a high level (periods P5 to P7) indicating the OFF state, each of the device control signals Csa, CSb, CSc for the FETs 51, 11 and 12 changes from a low level to a high level and the FETs 51, 11 and 12 are set as OFF-states, respectively. In this case, the potential difference V(1) between the input terminal 10a and the output terminal 10b increases as each of the switching time of the FETs 51, 11 and 12 goes on (period P5).

Thereafter, when the potential difference V(1) between the input terminal 10a and the output terminal 10b reaches to a saturation voltage corresponding to an ON-resistance of the FET 52, the device control signal CSd for the FET 52 is changed from a low level into a high level to thereby set the FET 52 as an OFF-state.

Accordingly, a current between the input terminal 30a and the output terminal 10b rapidly reduces as the switching time of the FET 52 goes on; the potential difference V(1) (Vds) between the input terminal 10a and the output terminal 10b rapidly increases (period P6) to thereby render the conducting path thereof to become a non-conducting state (period P7).

As a result, a turn-off time interval $t_{off}$ (switching time interval of the FEET 11) in the non-conducting state of the corresponding conducting path is shortened and accordingly the power loss during the turn-off time interval $t_{off}$ is also reduced.

Further, since the saturation voltage Vsat' can be reduced during the conducting state of the conducting path (periods P3 to P5), a power loss due to an equivalent of ON-resistances of FETs 51, 11, 12 and 52 also decreases. As a result, the turn-off time interval $t_{off}$ and the turn-off time interval can be shortened and accordingly the power loss during thereof can also be reduced.

Since the $t_{on}$ and the $t_{off}$ can be shortened, the switching circuit 10E can be operated with faster voltage ascending and descending by employing a light emitting element, e.g., an LED, in a circuit operated in response to a rectangular shape control signal. Accordingly, since a corresponding light emitting wave can be more closely approximated to a wave of a rectangular shape to thereby maintain the rectangular wave shape much longer, it can lengthen the communication distance when it is employed in the optical digital communication.

Instead of the FETs 11 and 12, if another FET which has lower ON-resistance than the FETs 11 and 12 is used, an equivalent resistance in the conducting state of the conducting path can be further reduced to thereby further decrease the power loss in the conducting state. An appropriate selection of the properties of the FETs 11 and 12 can alter either only the switching time interval or only the saturation voltage of the input and output terminals 10a and 10b. It is apparent that instead of the FETs 11 and 12, if active terminals (source and drains) of a plurality of FETs are connected in parallel, an equivalent resistance in the conducting state of the conducting path can be reduced to thereby further decrease the power loss in the conducting state.

If plurality of FETs having same short turn-on switching times as that the FET 51 are used in parallel connection and are alternately turned on at an initial state, then when turning from OFF-state to ON-state in the switching circuit, a stress applied to the FET can be dispersed to the FETs. When active terminals of three or more FETs are used in parallel connection, a stress applied to the FETs can be dispersed by alternating the FET which is initially turned on in sequence.

It should be noted that in the seventh preferred embodiment, an FET is used as a switching semiconductor device, but a transistor or another semiconductor device can be used to obtain the same effect.

Figure 15:
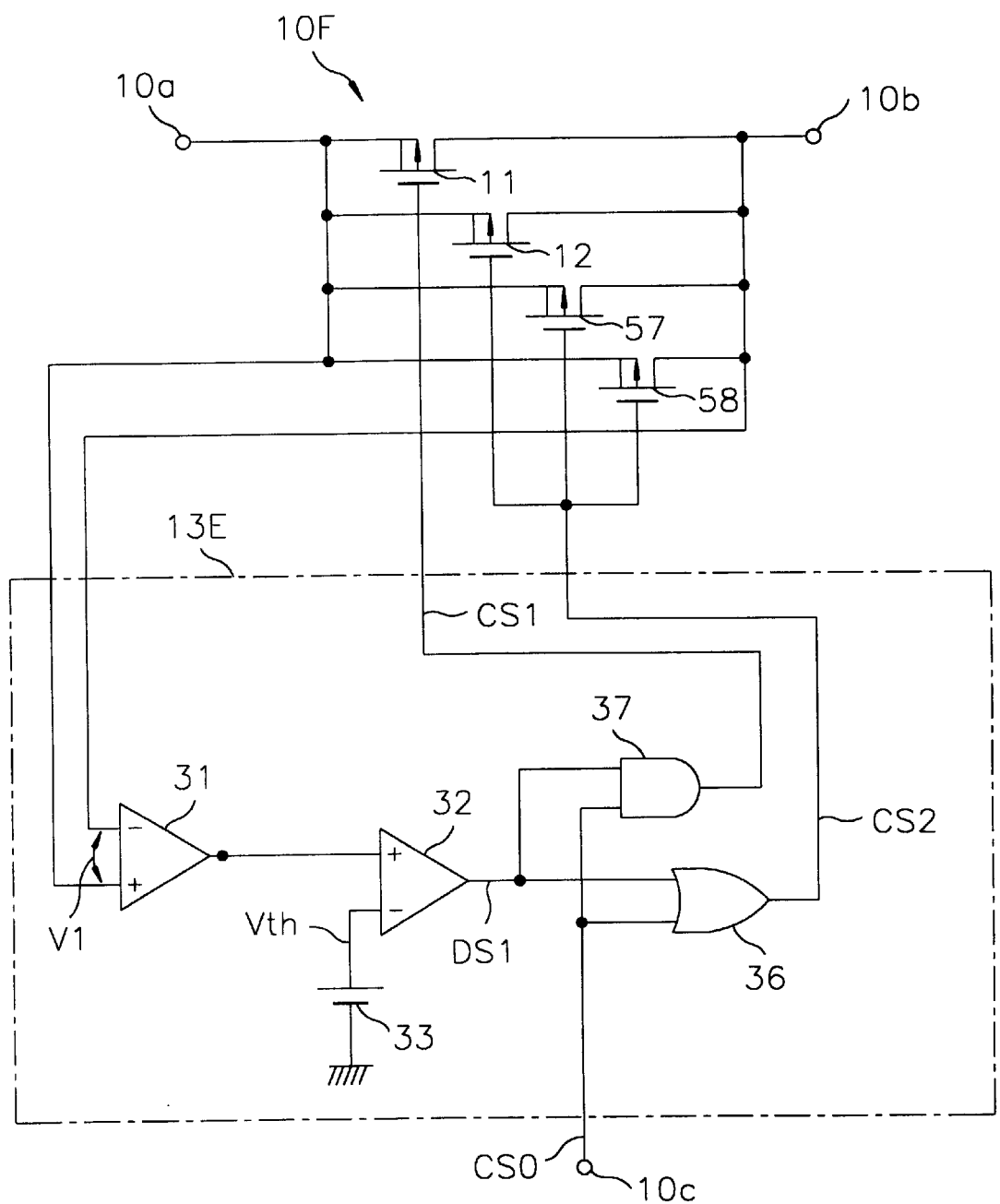
FIG. 15 represents a switching circuit in accordance with an eighth preferred embodiment of the present invention.

FIG. 15 represents a switching circuit 10F in accordance with an eighth preferred embodiment of the present invention. Referring to FIG. 15, the preferred embodiment of the present invention will be described.

In FIG. 15, same reference numerals as those of the fourth embodiment shown in FIG. 8 represent same devices or components; and therefore, the detailed description thereof is omitted. The eighth preferred embodiment of the present invention is different from the fourth embodiment in view of having FETs 57 and 58 instead of the FETs 11 and 12. The FETs 57 and 58 have lower ON-resistances than the FETs 11 and 12; and connected to the FET 12 in parallel. In the switching circuit 10F, a device control signal CS(2) is inputted to the gates of the FETs 12, 57 and 58 to thereby perform ON/OFF controls therefor.

As a result, a power loss due to an ON-resistance thereof can be significantly reduced by setting the FETs 57 and 58 having low ON-resistances as ON-states during a conducting state thereof except during the period of the turn-on and the turn-off thereof.

Figure 16:
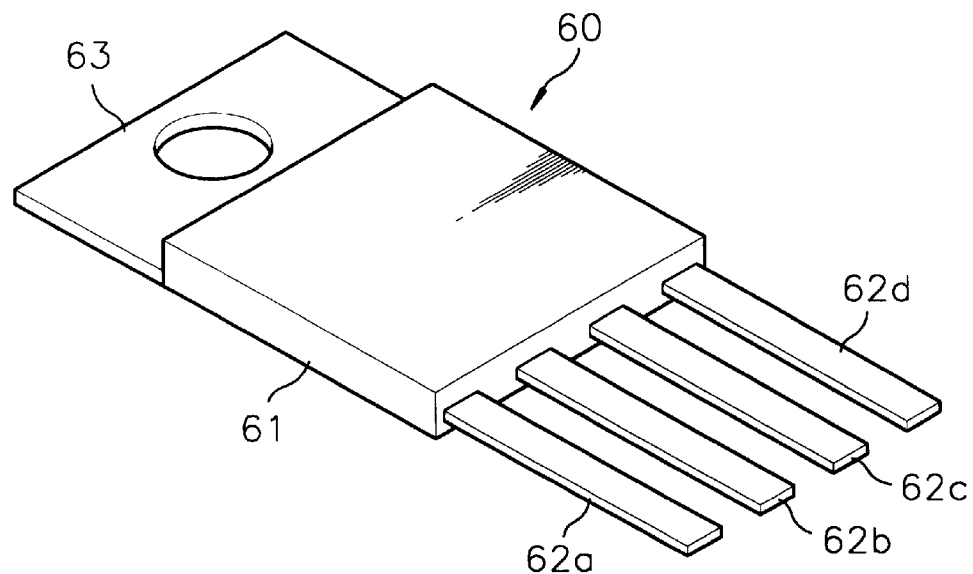
FIG. 16 shows a perspective view of an electronic switching component in accordance with a ninth preferred embodiment of the present invention.
Figure 17:
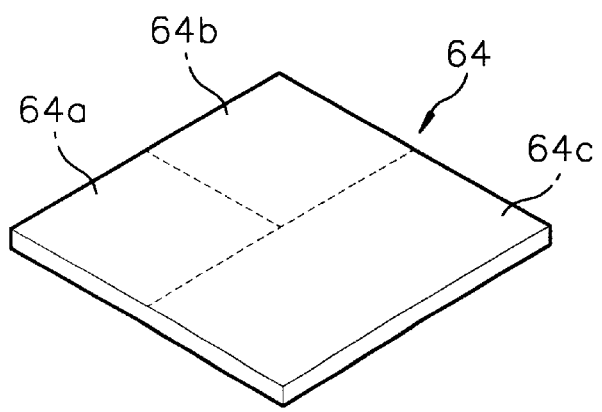
FIG. 17 depicts a perspective view of a semiconductor chip in accordance with the ninth preferred embodiment of the present invention.

FIG. 16 shows a perspective view of an electronic switching component 60 in accordance with a ninth preferred embodiment of the present invention. Referring to FIG. 16, the preferred embodiment of the present invention will be described. In FIG. 16, the electronic switching component 60 comprises a package 61, four evaluation terminals 62a to 62d and a heat dissipation plate 63 to thereby form a shape of a single in-line package. FIG. 17 depicts a perspective view of a semiconductor chip 64 in accordance with the ninth preferred embodiment of the present invention.

In the package 61, there is installed a semiconductor chip 64 having three rectangular-shaped regions 64a, 64b and 64c as depicted in FIG. 17. In tnis semiconductor chip 64, there is formed the switching circuit 10C (in FIG. 8) of the fourth embodiment, wherein the four evaluation terminals 62a to 62d correspond to input terminal 10a and output terminal 10b, the control signal input terminal 10c and the GND terminal, respectively The size of a first region 64a in the semiconductor chip 64 is ¼ the size of the semiconductor chip 64. In the first region 64a, there is formed an FET 11. The size of a second region 64b adjacent to the first region 64a in the semiconductor chip 64 is ¼ the size of the semiconductor chip 64. In the second region 64b, there is formed an FET 12. In a third region 64c having ½ the size of the chip 64, there is formed the control circuit 13C.

By employing the electronic switching component 60 instead of a conventional switching semiconductor device, a power loss during a switching operation thereof can be reduced.

Figure 18:
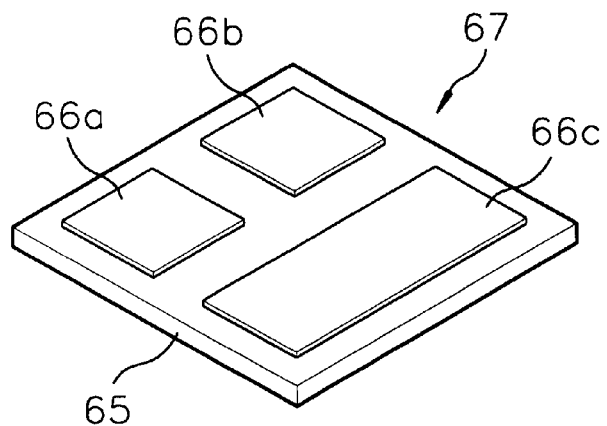
FIG. 18 sets forth a perspective view of a multi-chip in accordance with the ninth preferred embodiment of the present invention.

FIG. 18 sets forth a perspective view of a multi-chip 67 in accordance with the ninth preferred embodiment of the present invention. Instead of the semiconductor chip 64, the multi-chip 67 having plurality of semiconductor chips 66a to 66c mounted on top of an insulating substrate 65 may be used as shown in FIG. 18. In this case, to enhance the dissipation efficiency thereof, it is preferable that the three semiconductor chips 66a to 66c, i.e., the semiconductor chip 66a having the FET 11, the semiconductor chip 66b having the FET 12 and the semiconductor chip 66c having the control circuit 13C, are set apart from each other.

It should be noted that in the ninth embodiment, the electronic switching component constitutes the switching circuit 10C of the fourth embodiment, but the electronic switching component may constitute one of the switching circuits used in any of the embodiments described.

Figure 19:
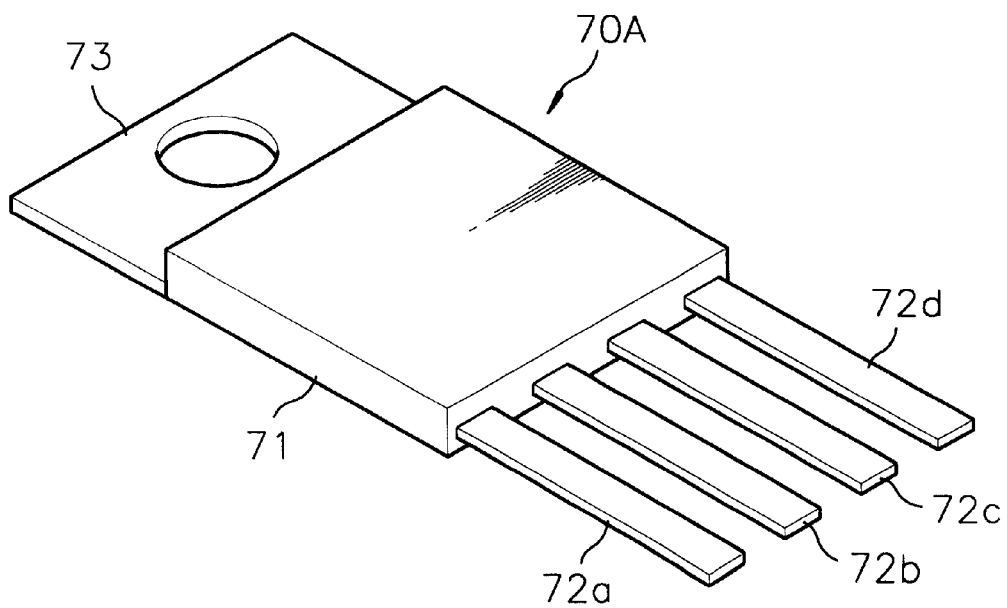
FIG. 19 shows a perspective view of an electronic switching component in accordance with a tenth preferred embodiment of the present invention.
Figure 20:
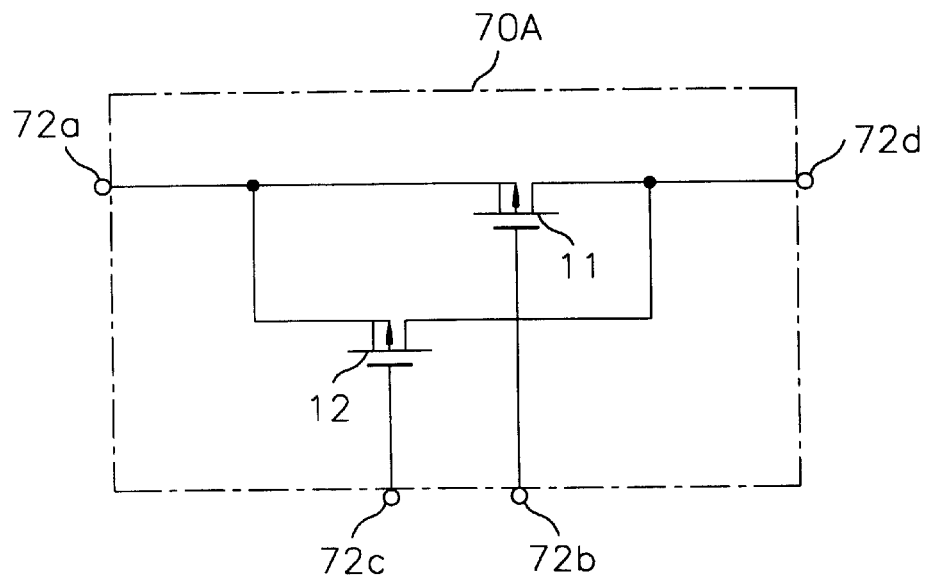
FIG. 20 represents a circuit diagram of the electronic switching component in accordance with the tenth preferred embodiment of the present invention.

FIG. 19 shows a perspective view of an electronic switching component 70A in accordance with a tenth preferred embodiment of the present invention. FIG. 20 represents a circuit diagram of the electronic switching component 70A in accordance with the tenth preferred embodiment of the present invention. Referring to FIGS. 19 and 20, the preferred embodiment of the present invention will be described. In FIG. 19, the electronic switching component 70A comprises a package 71, four evaluation terminals 72a to 72d and a heat dissipation plate 73 to thereby form a shape of a single in-line package.

In the package 71, there are installed two FETs 11 and 12 as depicted in FIG. 20. The FEETs 11 and 12, which have been used in the first embodiment, have short switching time intervals, i.e., the conversion time intervals between the ON and OFF states and have high ON-resistance thereof. The sources of the FETs 11 and 12 are connected to a terminal 72a; and the drains thereof are coupled to a terminal 72d. The gates of the FETs 11 and 12 are connected to terminals 72b and 72c, respectively.

By employing the electronic switching component 70A instead of a conventional switching semiconductor device, the switching circuit of the tenth embodiment can be simply accomplished.

Figure 21:
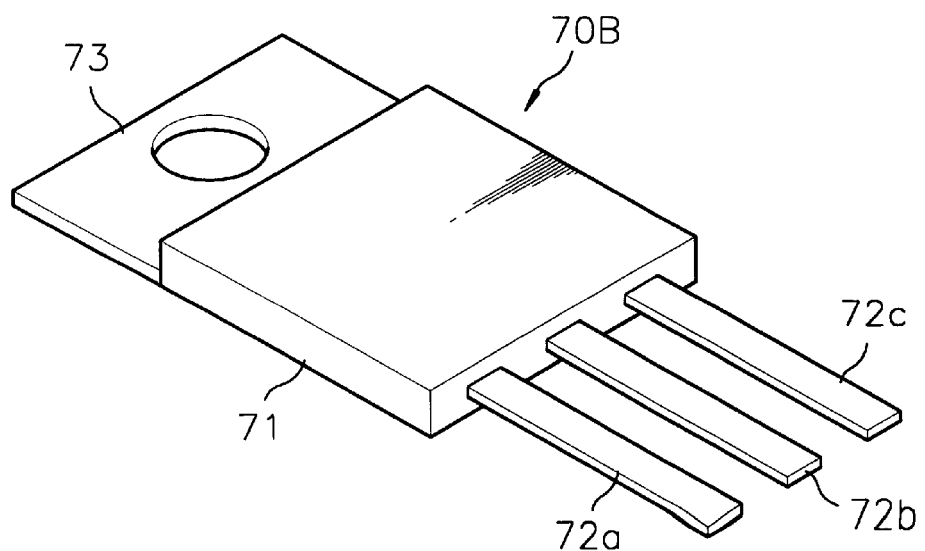
FIG. 21 depicts a perspective view of an electronic switching component in accordance with an eleventh preferred embodiment of the present invention.
Figure 22:
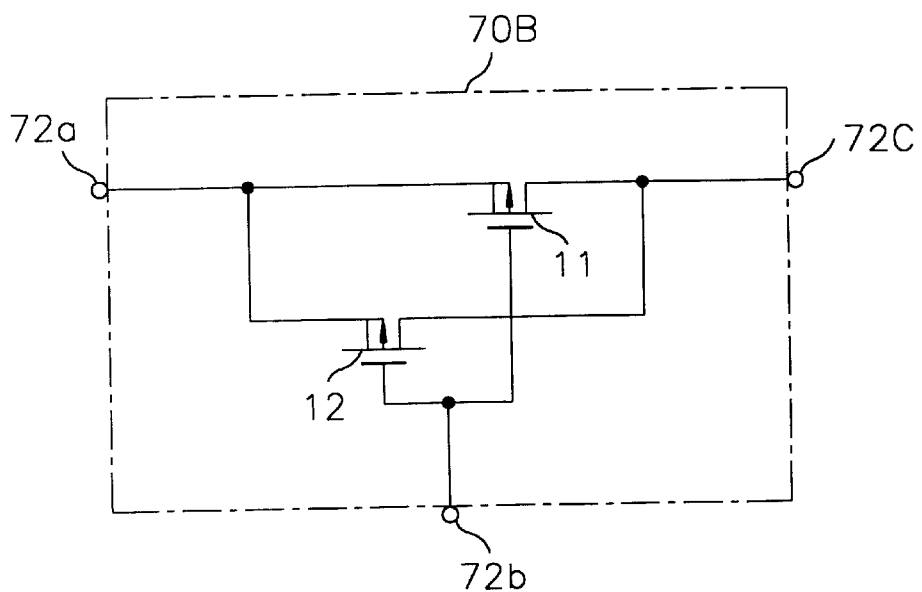
FIG. 22 presents a circuit diagram of the electronic switching component in accordance with the eleventh preferred embodiment of the present invention.

FIG. 21 depicts a perspective view of an electronic switching component 70B in accordance with an eleventh preferred embodiment of the preseni invention. FIG. 22 presents a circuit diagram of the electronic switching component 70B in accordance with the eleventh preferred embodiment of the present invention. Referring to FIGS. 21 and 22, the preferred embodiment of the present invention will be described. The main difference between the eleventh embodiment and the tenth embodiment is that in the eleventh embodiment, the gates of the FETs 11 and 12 are connected to one terminal. In FIG. 21, the electronic switching component 70B comprises a package 71, three evaluation terminals 72a to 72c and a heat dissipation plate 73 to thereby form a shape of a single in-line package including three terminals.

In the package 71, there are installed two FETs 11 and 12 as depicted in FIG. 22. These FETs 11 and 12, which have been used in the first embodiment, have short switching time intervals, i.e., the conversion time intervals between the ON and OFF states and have high ON-resistance thereof. The sources of the FETs 11 and 12 are connected to the terminal 72a; and the drains thereof are coupled to the terminal 72c. Each of the gates of the FETs 11 and 12 is connected to the terminal 72b.

By employing the electronic switching component 70B instead of a conventional switching semiconductor device, the switching circuit that reduces a power loss due to ON-resistance thereof can be easily obtained.

Figure 23:
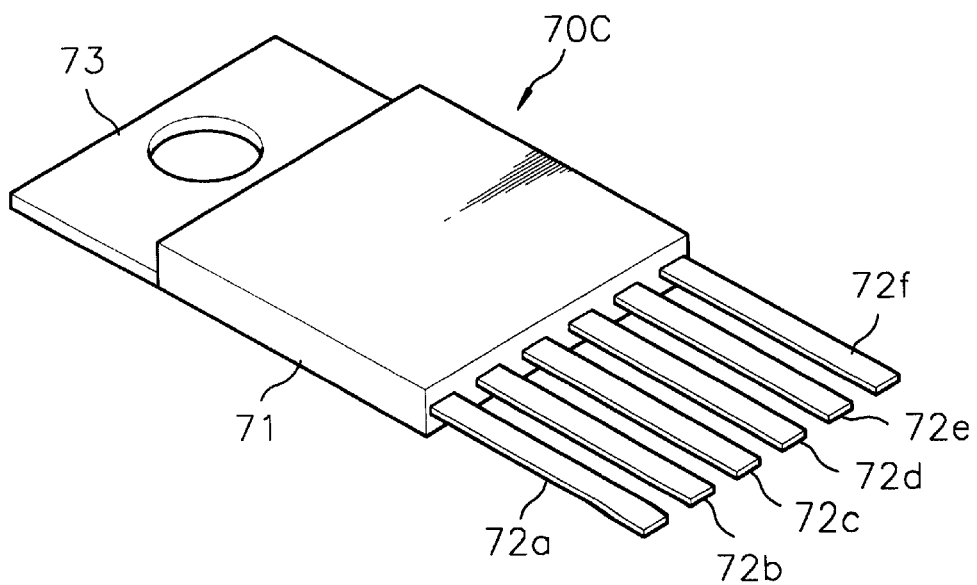
FIG. 23 sets forth a perspective view of an electronic switching component in accordance with a twelfth preferred embodiment of the present invention.
Figure 24:
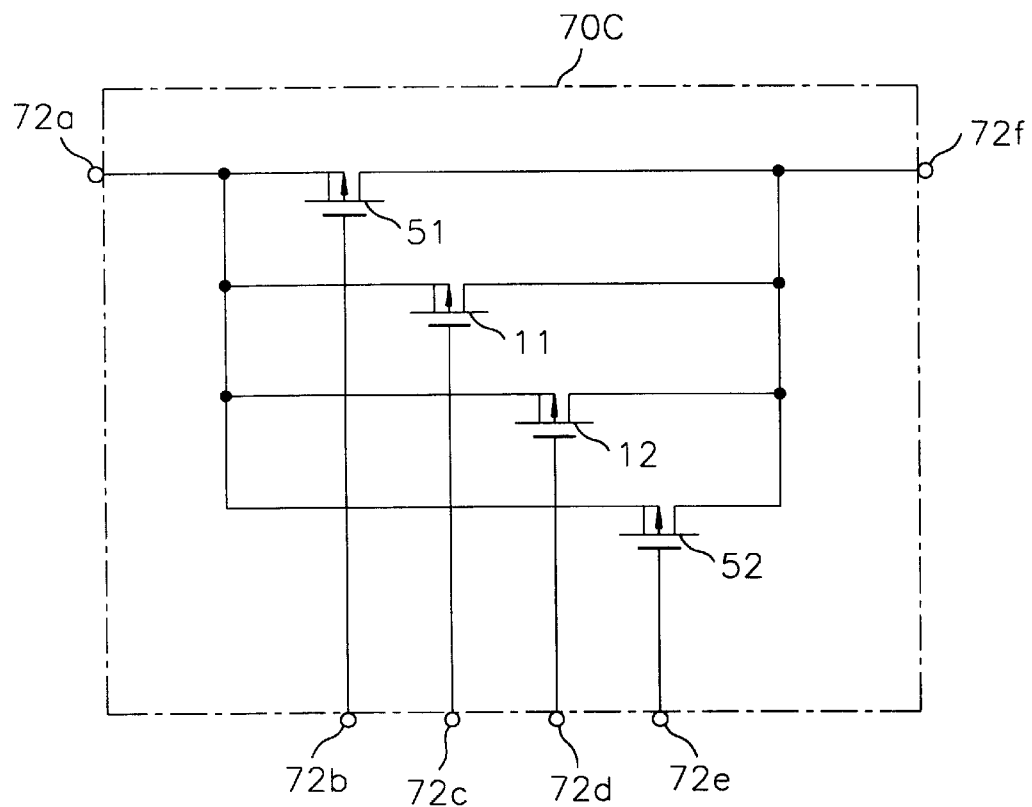
FIG. 24 gives a circuit diagram of the electronic switching component in accordance with the twelfth preferred embodiment of the present invention.

FIG. 23 sets forth a perspective view of an electronic switching component 70C in accordance with a twelfth preferred embodiment of the present invention. FIG. 24 gives a circuit diagram of the electronic switching component 70C in accordance with the twelfth preferred embodiment of the present invention. In FIG. 23, the electronic switching component 70C comprises a package 71, six evaluation terminals 72a to 72f and a heat dissipation plate 73 to thereby form a shape of a single in-line package including six terminals.

In the package 71, there are installed four FETs 11, 12, 51 and 52 as depicted in FIG. 24. These FETs 11, 12, 51 and 52 have been used in the seventh embodiment. Namely, the FETs 11 and 12 have short switching time intervals and have high ON-resistance thereof. The switching time interval of the FET 51 during a turn-on operation thereof is shorter than that each of the FETs 11 and 12; the switching time interval thereof during a turn-off operation thereof is longer than that each of the FETs 11 and 12. The switching time interval of the FET 52 during a turn-off operation thereof is shorter than that each of the FETs 11 and 12; the switching time interval thereof during a turn-on operation thereof is longer than that each of the FETs 11 and 12. As described in the above, there is an inverse proportional relationship between the switching speed of the FET and the ON-resistance thereof.

The FETs 11, 12, 51 and 52 are coupled in parallel. The sources of the FETs 11, 12, 51 and 52 are connected to the terminal 72a; and the drains thereof are coupled to the terminal 72f. The gates of the FETs 11, 12, 51 and 52 are connected to terminals 72b to 72e, respectively. By employing the electronic switching component 70C instead of a conventional switching semiconductor device, the switching circuit of the twelfth embodiment can be easily obtained.

Figure 25:
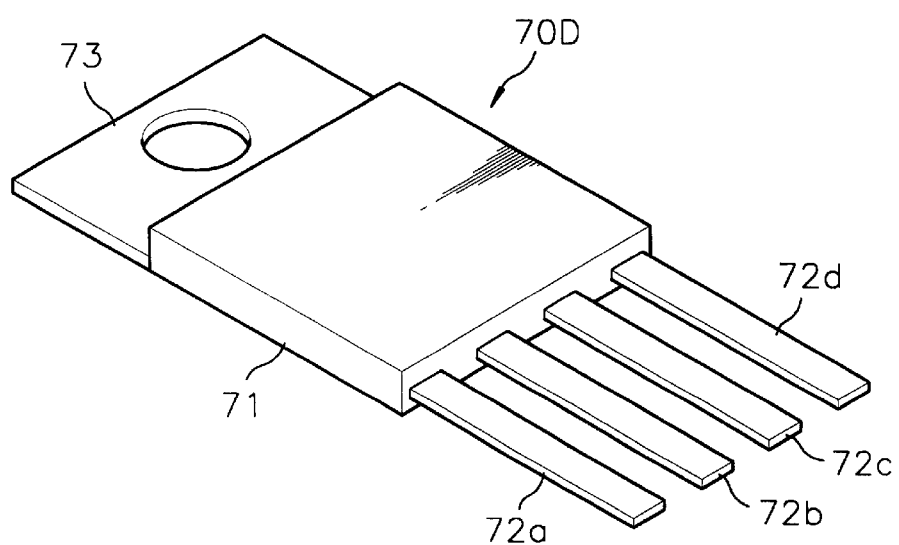
FIG. 25 shows a perspective view of an electronic switching component in accordance with a thirteenth preferred embodiment of the present invention.
Figure 26:
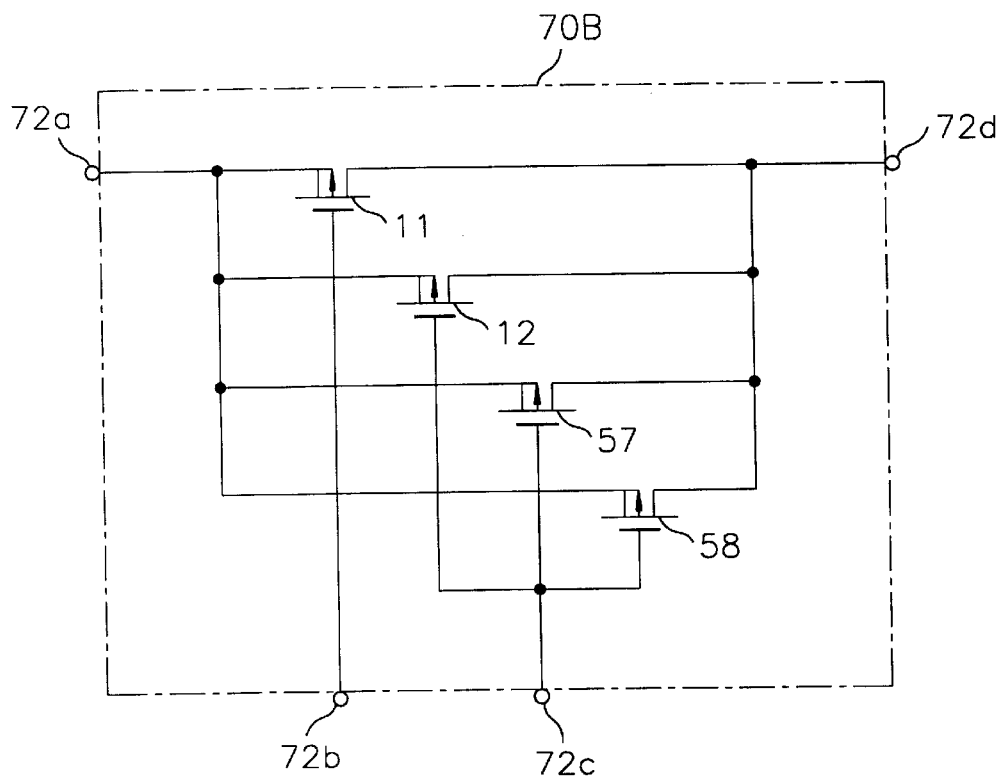
FIG. 26 represents a circuit diagram of the electronic switching component in accordance with the thirteenth preferred embodiment of the present invention.

FIG. 25 shows a perspective view of an electronic switching component 70D in accordance with a thirteenth preferred embodiment of the present invention. FIG. 26 represents a circuit diagram of the electronic switching component 70D in accordance with the thirteenth preferred embodiment of the present invention. In the thirteenth embodiment, for two FETs 11 and 12 used in the tenth embodiment, FETs 57 and 58 having lower ON-resistance than the FETs 11 and 12 are connected in parallel; and the gates of the FETs 57 and 58 are coupled to a terminal 72C which is connected to the gate of FET 12. By employing the electronic switching component 70D described above, the switching circuit of the thirteenth embodiment can be easily obtained.

Figure 27:
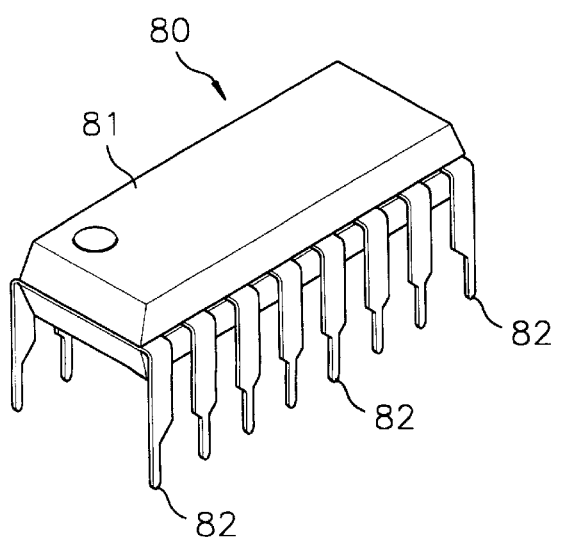
FIG. 27 depicts a perspective view of an electronic switching control component in accordance with a fourteenth preferred embodiment of the present invention.
Figure 28:
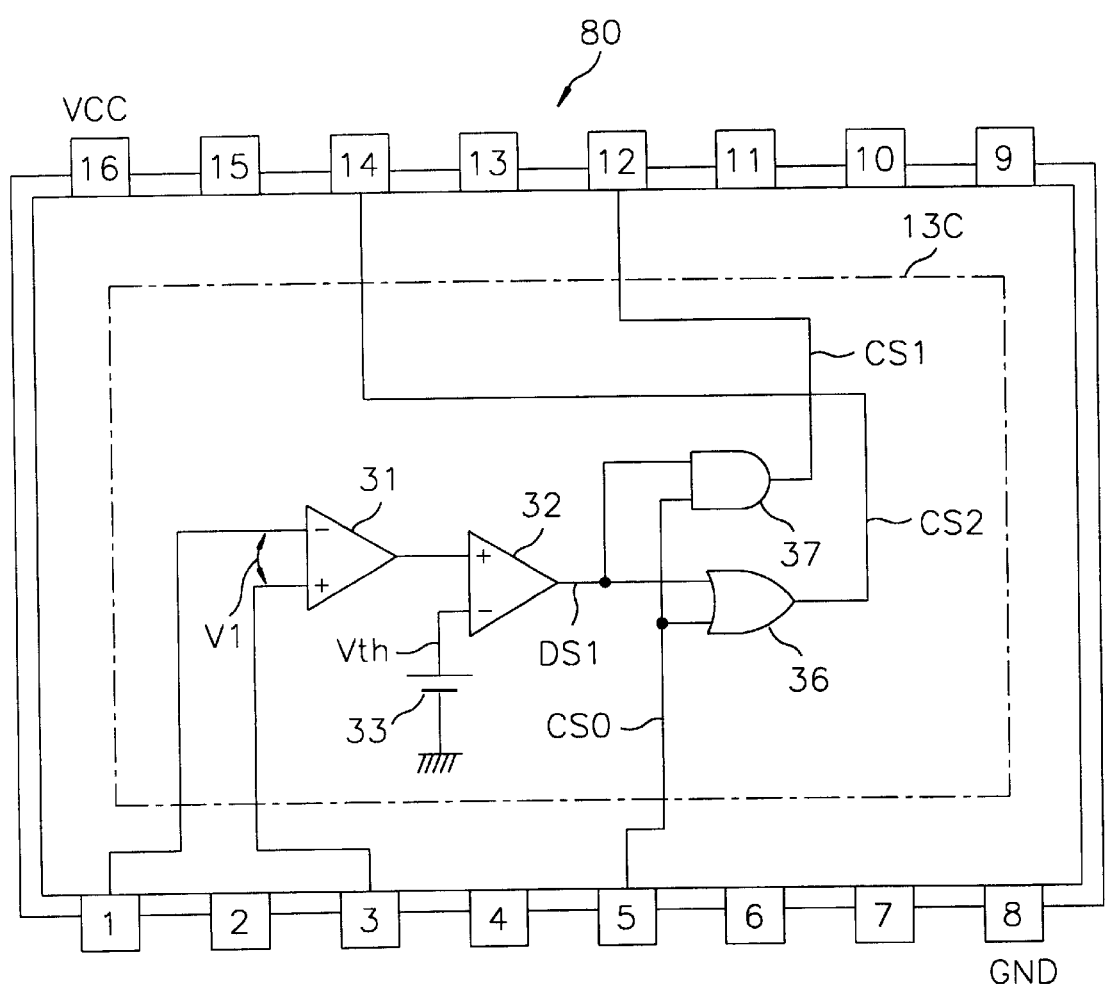
FIG. 28 sets forth a circuit diagram and a terminal connection of the electronic switching control component in accordance with the fourteenth preferred embodiment of the present invention.

FIG. 27 depicts a perspective view of a switching control electronic component 80 in accordance with a fourteenth preferred embodiment of the present invention. FIG. 28 sets forth a circuit diagram and a terminal connection of the switching control electronic component 80 in accordance with the fourteenth preferred embodiment of the present invention. The fourteenth embodiment unites the control circuit 13C of the forth embodiment as one electronic part.

In FIG. 27, the switching control electronic component 80 comprises a package 81, sixteen evaluation terminals 82 to thereby form a shape of a dual in-line package including sixteen terminals. By employing the switching control electronic component 80 described above, the switching circuit of the fourteenth embodiment can be easily obtained.

Figure 29:
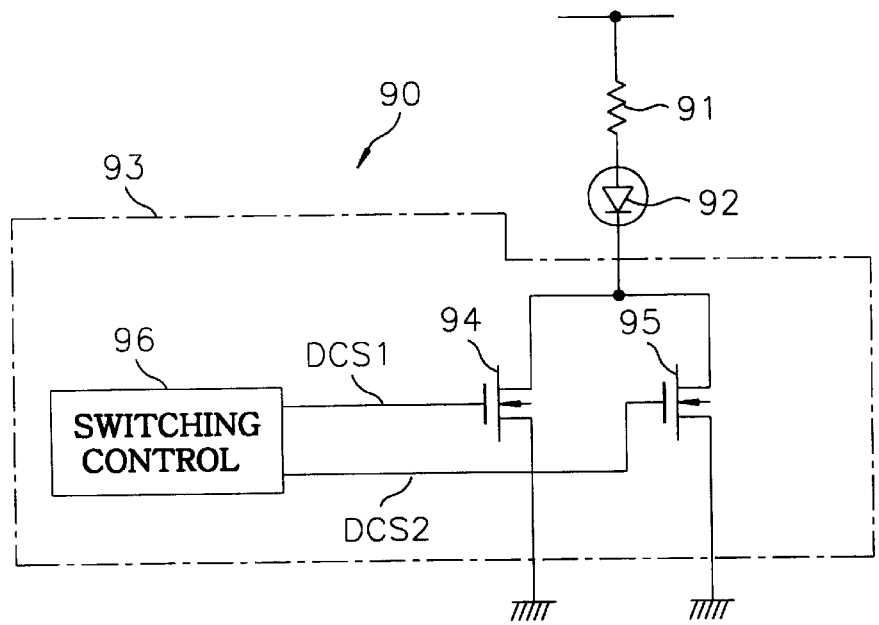
FIG. 29 represents a circuit diagram of an LED Light emitting circuit in accordance with the fourteenth preferred embodiment of the present invention.
Figure 30:
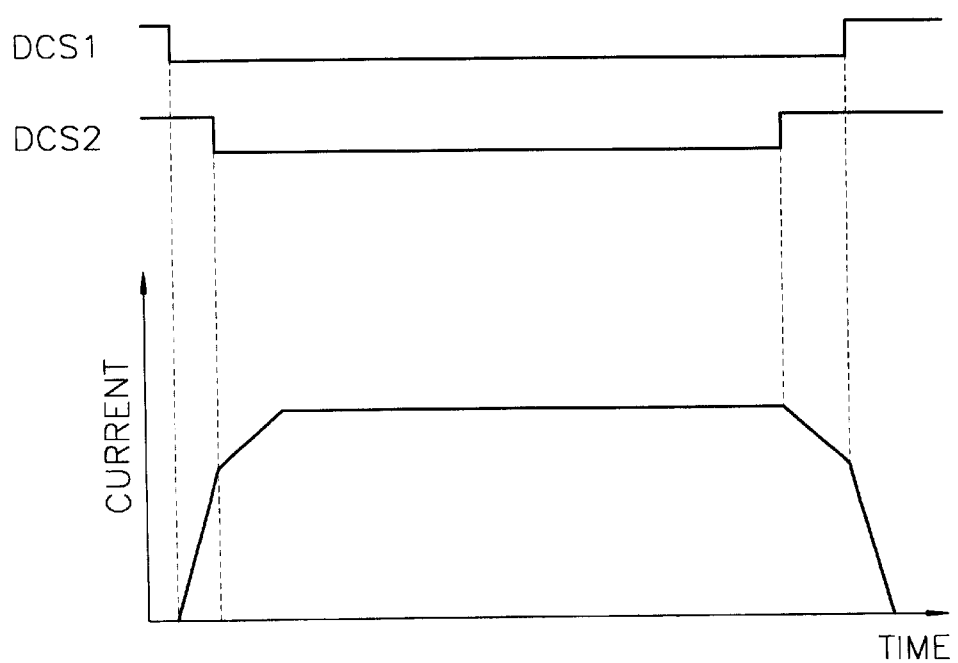
FIG. 30 gives a diagram of the conducting property of the LED light emitting circuit in accordance with the fourteenth preferred embodiment of the present invention.

FIG. 29 represents a circuit diagram of an LED light emitting circuit 90 in accordance with the fourteenth preferred embodiment of the present invention. FIG. 30 gives a diagram of the conducting property of the LED light emitting circuit 90 in accordance with the fourteenth preferred embodiment of the present invention. The LED light emitting circuit 90 comprises a resistance 91, an LED 92 and a switching circuit 93. An anode of the LED 92 is connected to a power supply through the resistance 91. The switching circuit 93 includes FETs 94 and 95 and a switching control circuit 96 for switching between ON/OFF states of the FETs 94 and 95.

The switching time of the FET 94 is shorter than that of the FET 95; and the saturation resistance of the FET 94 is higher than that of the FET 95. Each of the sources of the FETs 94 and 95 is connected to a cathode of the LED 92; and the drains thereof are coupled to the ground. Device control signals DCS1 and DCS2 outputted from the switching control circuit 96 are inputted to the gates of the FETs 94 and 95, respectively.

The output timing of the device control signals DCS1 and DCS2 and current of the LED 92 are represented in FIG. 30. As shown in FIG. 30, when the voltage between the source and drain of FET 94 reaches a saturation value after the FET 94 has been initially set in ON-state, the FET 95 is set in ON-state, wherein the FET 94 and the FET 95 have a shorter switching time interval and lower saturation voltage. Accordingly, the switching time interval is reduced.

During the switching from the conducting state to the non-conducting state, after setting the FET 95 in OFF-state, when the voltage between the source and the drain of the FET 94 reaches a saturation value, the FET 94 is set in OFF-state. Accordingly, the switching time interval from the conducting state to the non-conducting state thereof can be reduced.

When the FET 95 is set in ON-state, the FETs 94 and 95 are connected in parallel, and accordingly the saturation voltage is further reduced and a much larger amount of current flows through in comparison to the case when only the FET 94 is in ON-state. As a result, this embodiment enables the switching speed to be faster; enhances the light emitting intensity; and relieves the dullness of the light signal to thereby increase a signal transmitting distance thereof when it is employed in the optical communication.

Figure 31:
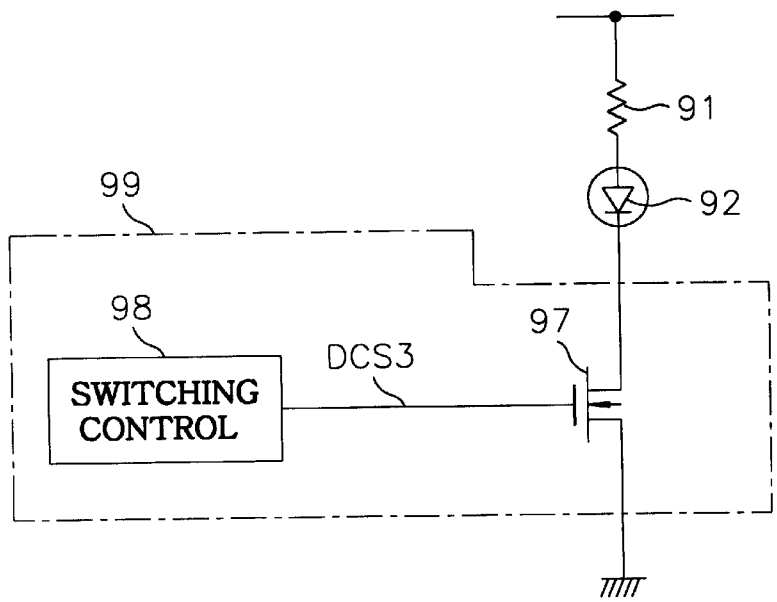
FIG. 31 shows a circuit diagram of a conventional LED light emitting circuit in relation to the fourteenth preferred embodiment of the present invention.
Figure 32:
FIG. 32 sets forth a diagram of the conducting property of the conventional LED light emitting circuit shown in FIG. 31.
Figure 32:
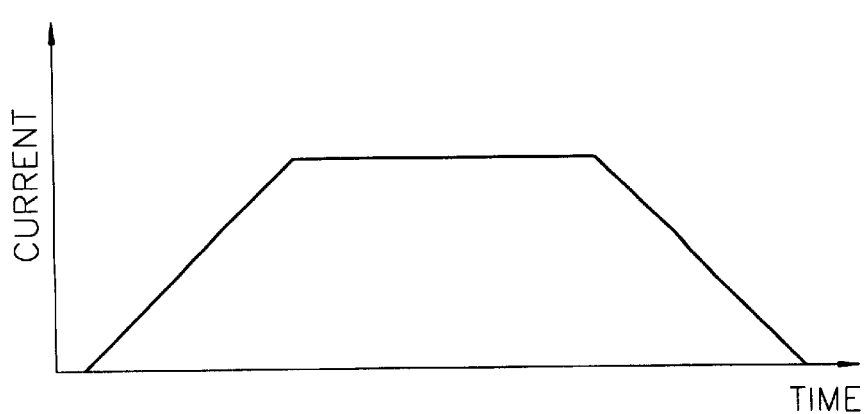

FIG. 31 shows a circuit diagram of a conventional LED light emitting circuit in relation to the fourteenth preferred embodiment of the present invention. FIG. 32 sets forth a diagram of the conducting property of the conventional LED light emitting circuit shown in FIG. 31.

The conventional LED light emitting circuit includes an FET 97 and a switching part 99 having a switching control circuit 98 to control the ON/OFF state of the FET 97. In this conventional circuit, as the switching speed of the FET 97 increases, the saturation voltage increases and the emitting intensity decreases and accordingly, it becomes impossible to lengthen the signal transmitting distance. If an FET having a low saturation voltage is used as the FET 97, the switching speed decreases and the light signal wave becomes dull and accordingly, the signal transmitting distance cannot be lengthened.

Figure 33:
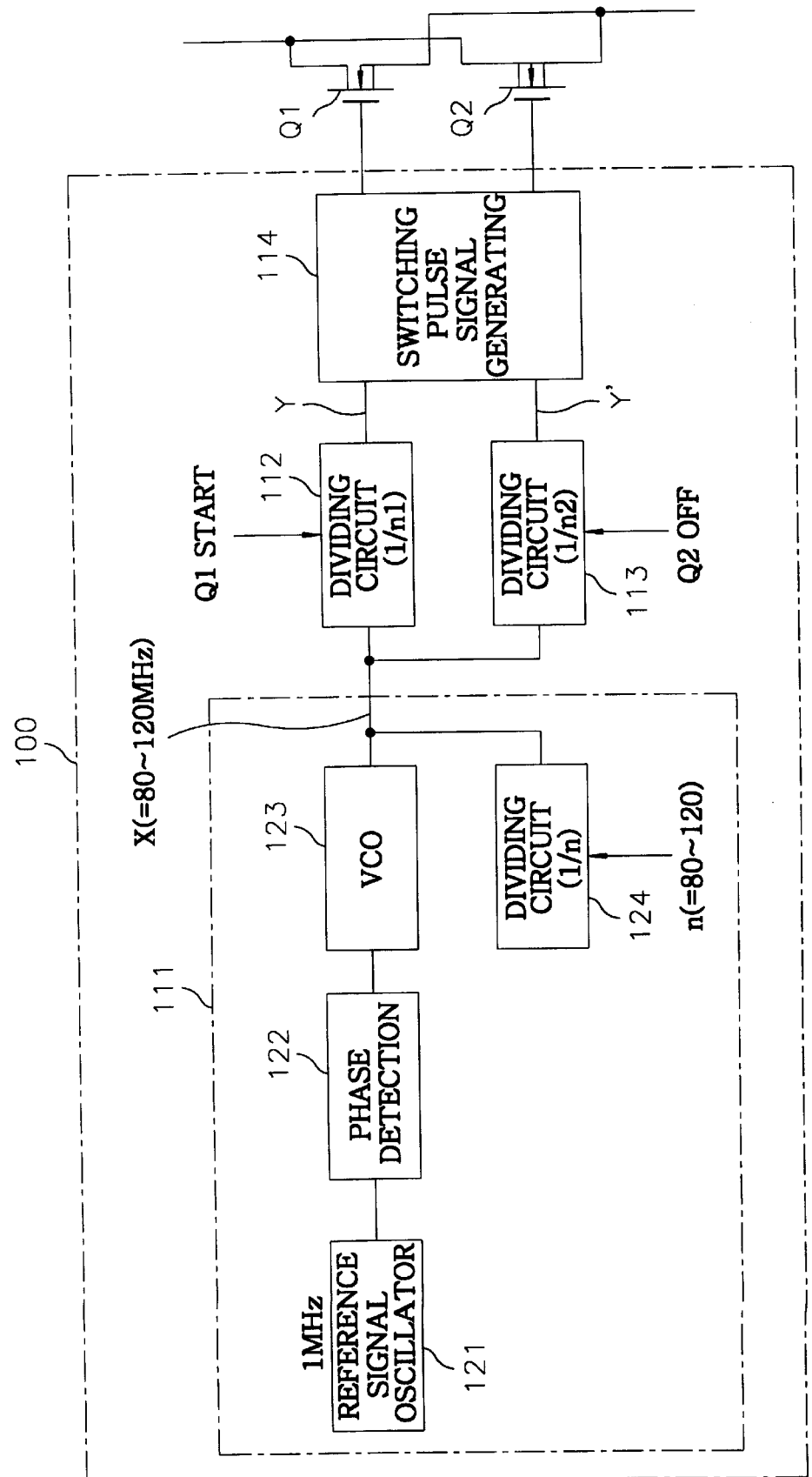
FIG. 33 presents a diagram of a switching control circuit in accordance with a fifteenth preferred embodiment of the present invention.

FIG. 33 presents a diagram of a switching control circuit in accordance with a fifteenth preferred embodiment of the present invention. FIGS. 34 to 37 show timing diagrams of a switching control operation in accordance with the fifteenth preferred embodiment of the present invention. In FIG. 33, a switching circuit 100 includes a phage-locked loop (PLL) circuit 111, dividing circuits 112 and 113 and a switching pulse signal generating circuit 114. The switching circuit 100 controls ON/OFF states of two FETs Q1 and Q2.

The PLL circuit 111 includes a reference signal oscillator 121, a phage detection circuit 122, voltage control oscillator (VCO) 123 and a dividing circuit 124. The PLL circuit 111 outputs a clock signal X ranging from 80 to 120 MHz in response to a dividing factor ranging from 80 to 120 inputted to the dividing circuit 124.

The dividing circuit 112 outputs an ON-state timing signal Y corresponding to the dividing factor n(1) in response to a signal Q1 start indicating conversion of the ON-state of the FET Q1 and the clock signal X. The dividing circuit 113 outputs an OFF-state setting timing signal Y' corresponding to the dividing factor n(2) in response to a signal Q2off indicating conversion to the OFF-state of the FET Q2 and the clock signal X. The switching pulse generation circuit 114 outputs device control signals for the FETs Q1 and Q2 to the gates of the FETs Q1 and Q2 in response to the ON-state timing signal Y and the OFF-state setting timing signal Y' inputted thereto, respectively.

Figure 34:
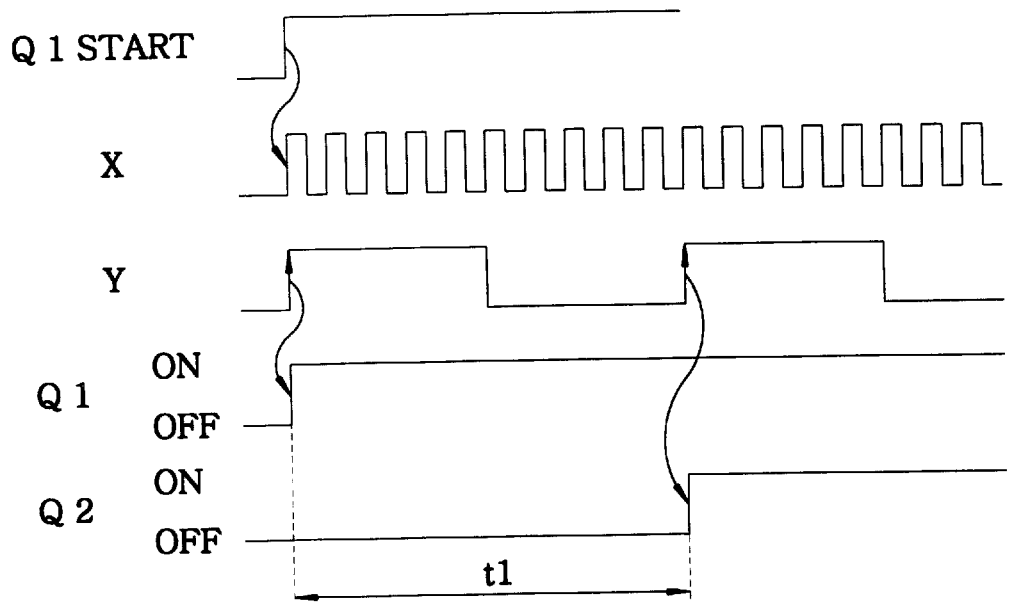
FIG. 34 shows a timing diagram of a switching control operation in accordance with the fifteenth preferred embodiment of the present invention.

Referring to FIGS. 34 to 37, the operation of the switching circuit 100 will be described. For example, if dividing factors n and n(1) set in the dividing circuits 124 and 112 are 100 and 10, respectively, during turning from the non-conducting state to the conducting state thereof, as shown in FIG. 34, when the Q1start increases from a low level to a high level, the ON-state setting timing signal Y changes from a low level to a high level and this is inverted at every 5 clocks in response to a clock signal X.

At the timing of the first elevation of the Y, the switching pulse signal generating circuit 114 sets the FET Q1 in ON-state; and at the timing of the second elevation of the Y, the circuit 114 sets the FET Q2 in ON-state. In this case, the clock signal X has a frequency of 100 MHz; and a time t(1) that is a time interval from the setting of the FET Q1 in ON-state to the setting of the FET Q2 in ON-state will be 100 nsec.

If dividing factors n and n(1) set in the dividing circuits 124 and 112 are 80 and 10, respectively, the clock signal X has a frequency of 80 MHz; and a time t(1), the time interval from the setting of the FET Q1 in ON-state to the setting of the FET Q2 in ON-state, will be 125 nsec. If dividing factors n and n(1) set in the dividing circuits 124 and 112 are 120 and 10, respectively, the clock signal X has a frequency of 120 MHz; and a time t(1), the time interval from the setting of the FET Q1 in ON-state to the setting of the FET Q2 in ON-state, will be 83.3 nsec.

Figure 35:
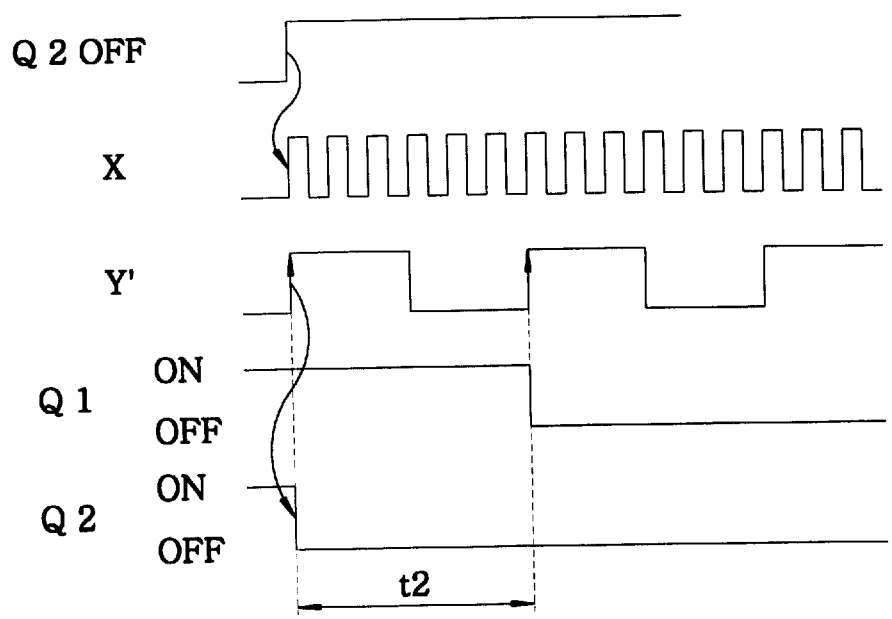
FIG. 35 represents another timing diagram of a switching control operation in accordance with the fifteenth preferred embodiment of the present invention.

If dividing factors n and n(2) set in the dividing circuits 124 and 113 are 100 and 6, respectively, during turning from the conducting state to the non-conducting state thereof, as shown in FIG. 35, when the Q2off changes from a low level to a high level, the OFF-state setting timing signal Y' changes from a low level to a high level and this will be inverted at every 3 clocks in response to the clock signal X.

At the timing of the first elevation of the Y', the switching pulse signal generating circuit 114 sets the FET Q2 in OFF-state; and at the timing of the second elevation of the Y', the circuit 114 sets the FET Q1 in OFF-state. In this case, the clock signal X has a frequency of 100 MHz; and a time t(2), a time interval from the setting of the FET Q2 in OFF-state to the setting of the FET Q1 in OFF-state, will be 60 nsec.

If dividing factors n and n(1) set in the dividing circuits 124 and 113 are 80 and 6, respectively, the clock signal X has a frequency of 80 MHz; and the time t(2), the time interval from the setting of the FET Q2 in OFF-state to the setting of the FET Q1 in OFF-state, will be 75 nsec. If dividing factors n and n(1) set in the dividing circuits 124 and 113 are 120 and 6, respectively, the clock signal X has a frequency of 120 MHz; and the time t(2), the time interval from the setting of the FET Q2 in OFF-state to the setting of the FET Q1 in OFF-state, will be 50 nsec. Accordingly, the switching pulse signal generating circuit 114 can set the ON/OFF converting timing of the FETs Q1 and Q2 preferably, e.g., as illustrated in FIGS. 36 and 37.

Figure 36:
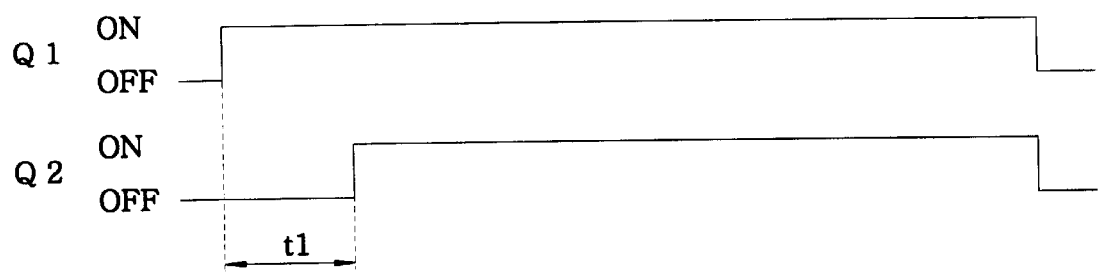
FIG. 36 depicts yet another timing diagram of a switching control operation in accordance with the fifteenth preferred embodiment of the present invention.
Figure 37:
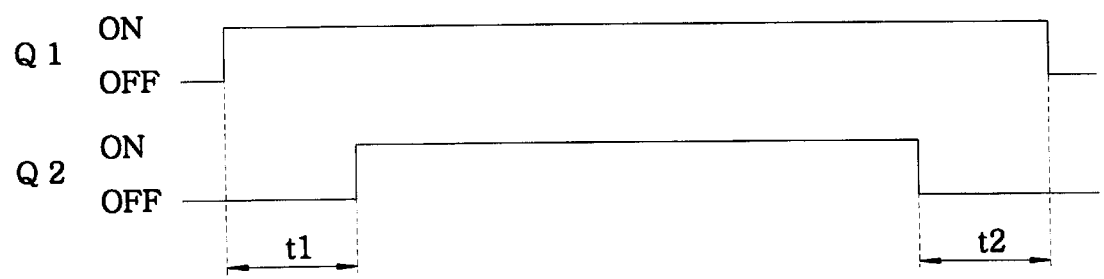
FIG. 37 presents still yet another timing diagram of a switching control operation in accordance with the fifteenth preferred embodiment of the present invention.

For example, as shown in FIG. 36, it is possible to set the FET Q2 in ON-state at a time delayed by time t(1) from the time at which the FET Q1 is set in ON-state only when the non-conducting state thereof is converted to the conducting state thereof. Further, as shown in FIG. 37, it is also possible to set the FET Q1 in OFF-state at a time delayed by time t(2) from the time at which the FET Q2 is set in OFF-state when the conducting state thereof is converted to the non-conducting state thereof.

The above-mentioned embodiments are just examples; and accordingly, the present invention is not limited to such embodiments. The present invention uses two or more switching semiconductor devices in combination to thereby reduce the ON/OFF converting time interval and the power loss thereof. In converting from the conducting state to the non-conducting state, it is preferable to turn on two or more devices simultaneously in order to enhance the switching speed and reduce the power loss thereof, wherein the two or more devices includes at least a device having a high switching speed.

Further, in converting from the conducting state to the non-conducting state, it is preferable to set one device having a high switching speed in ON-state and the other devices in OFF-states; and then around a saturation voltage, it is preferable to set the one device having the high switching speed in OFF-state to thereby maximize the switching speed and reduce the power loss thereof.

The device having the high switching speed used in the converting operation may be maintained in the OFF-state if the saturation voltage is maintained at a sufficiently low level during the conducting state thereof. If switching semiconductors having high current passing capacities are used in parallel, the high current passing capability of a corresponding switching circuit can be obtained.

In the preferred embodiments, FETs are used as switching semiconductor devices, but transistors may be used as the switching semiconductor devices. When emitters and collectors of a plurality of transistors are connected in parallel, since the converting timing between the conducting state and the non-conducting state can be performed in the same manner as the above cases using the FETs, the switching speed can be increased without increasing ON-resistance corresponding to the saturation voltage of the transistors or the ON-resistance corresponding to the saturation voltage can be reduced without decreasing the switching speed to thereby reduce the power loss thereof.

In view of the foregoing, in accordance with the present invention, there are many effects as described below. In accordance with a switching control method of the present invention, since active terminals of two or more switching semiconductor devices can be used in parallel connection thereof, the ON-resistance (saturation voltage) connected to the conducting path in serial is lowered in comparison with the case using one unit as the switching semiconductor device. Accordingly, the power loss due to the ON-resistance of the switching semiconductor device in ON-state thereof is reduced. Further, the switching time interval is decreased to thereby reduce the power loss due to the switching thereof.

In accordance with a switching circuit of the present invention, since active terminals of two or more switching semiconductor devices can be used in parallel connection thereof, the ON-resistance (saturation voltage) connected between the input and output terminals in serial is lowered in comparison with the case using one unit as the switching semiconductor device. Accordingly, the power loss due to the ON-resistance of the switching semiconductor device in ON-state thereof is reduced. Further, the switching time interval is decreased to thereby reduce the power loss due to the switching thereof.

In accordance with an electronic switching component of the present invention, since two or more switching semiconductor devices are connected to the input and output terminals in parallel, these semiconductor devices can be used together. Since all of the semiconductor switching devices can be turned on by employing these semiconductor devices together, the ON-resistance (saturation voltage) can be reduced in comparison with the case using one unit as the switching semiconductor device. Thus when the outer input and output terminals are in conducting state, the power loss due to the ON-resistance of the switching semiconductor can be reduced. Further, by converting only one switching semiconductor device in converting between ON and OFF states, the switching time interval and the power loss during the switching time interval can be minimized.

In accordance with another electronic switching component of the present invention, the converting between the conducting and non-conducting states of the outer input and output terminals can be carried out by inputting one control signal. The power loss due to the switching and ON-resistance (saturation voltage) of the switching semiconductor device can be decreased.

In accordance with an electronic switching control component of the present invention, the ON/OFF control of two or more semiconductor devices can be accomplished in response to one control signal. In case that active terminals of two or more switching semiconductor devices are used in parallel connection thereof, the power loss due to the switching and ON-resistance (saturation voltage) of the switching semiconductor device can be decreased.

While the present invention has been described with respect to certain preferred embodiments only, other modifications and variations may be made without departing from the spirit and scope of the present invention as set forth in the following claims.

What is claimed is:

1. A switching control method for connecting switching semiconductor devices to a conducting path and switching between a conducting state and a non-conducting state of the conducting path, the method comprising the steps of:

(a) connecting active terminals of two or more switching semiconductor devices in parallel; and (b) switching between a conducting state and a non-conducting state of the conducting path by employing the two or more switching semiconductor devices, wherein devices which convert ON states and OFF states thereof by comparing threshold levels with either control current levels or control voltage levels thereof are used as the switching semiconductor devices; a threshold level for each of the switching semiconductor devices is set differently in accordance with the converting sequence of the ON states and OFF states thereof; and the converting between the conducting state and the non-conducting state of the conducting path is performed through the use of a wave form signal for use in converting the ON state and OFF state of each of the switching semiconductor devices individually by employing the difference between the threshold levels.

2. A switching control method for connecting switching semiconductor devices to a conducting path and switching between a conducting state and a non-conducting state of the conducting path, the method comprising the steps of:

(a) connecting active terminals of two or more switching semiconductor devices in parallel, wherein the two or more switching semiconductor devices have at least one switching semiconductor device having a higher switching speed than the other switching semiconductor devices; and (b) switching between a conducting state and a non-conducting state of the conducting path by employing the two or more switching semiconductor devices.

3. The switching control method according to claim 1 or 2, wherein active terminals of two or more switching semiconductor devices are connected to each other in parallel, the two or more switching semiconductor devices having at least one switching semiconductor device having a lower saturation voltage between corresponding terminals than the other switching semiconductor devices.

4. The switching control method according to claim 2, wherein to said at least one switching semiconductor device having a higher switching speed, an active terminal of a switching semiconductor device having a higher current conducting capacity than said at least one switching semiconductor device is connected in parallel and then used together.

5. The switching control method according to claim 2, wherein when the conducting path is setting in the conducting state, one switching semiconductor device having a higher switching speed from an OFF state to an ON state than the other switching semiconductor devices is initially set in an ON state.

6. The switching control method according to claim 1, wherein when the conducting path is setting in the conducting state, after setting one switching semiconductor device in an ON state, the other switching semiconductor device is set in an ON state if a voltage between terminals of said one switching semiconductor device reaches around a saturation value thereof.

7. The switching control method according to claim 1, wherein when the conducting path is setting in the conducting state, after setting one switching semiconductor device in an ON state, switching another switching semiconductor device from an OFF state to an ON state is performed if a voltage between terminals of said one switching semiconductor device set in the ON state just prior to said another switching semiconductor device decreases to a predetermined percent of a voltage between terminals of said one switching semiconductor device at the moment that said one switching semiconductor device is to be set in an ON state.

8. The switching control method according to claim 2, wherein when the conducting path is setting in the non-conducting state, one switching semiconductor device having a higher switching speed from an ON state to an OFF state than the other switching semiconductor devices is lastly set in an OFF state.

9. The switching control method according to claim 1, wherein when the conducting path is setting in the non-conducting state, after setting all switching semiconductor devices except a predetermined switching semiconductor devices in OFF states, said predetermined switching semiconductor devices is set in an OFF state.

10. The switching control method according to claim 1 or 2, wherein when the conducting path is converted from the non-conducting state to the conducting state, other switching semiconductor devices are used in sequence as the switching semiconductor device which has been initially set in the ON state.

11. The switching control method according to claim 1 or 2, wherein when the conducting path is setting in the conducting state, each of the switching semiconductor devices is set in an ON state one by one in increasing order of the switching speed from the OFF-state to the ON-state thereof.

12. The switching control method according to claim 1 or 2, wherein when the conducting path is setting in the conducting state, all of the switching semiconductor devices are set in ON states simultaneously.

13. The switching control method according to claim 2, wherein devices which convert ON states and OFF states thereof by comparing threshold levels with either control current levels or control voltage levels thereof are used as the switching semiconductor devices; a threshold level for each of the switching semiconductor devices is set differently in accordance with the converting sequence of the ON states and OFF states thereof; and the converting between the conducting state and the non-conducting state of the conducting path is performed through the use of a wave form signal for use in converting the ON state and OFF state of each of the switching semiconductor devices individually by employing the difference between the threshold levels.

14. The switching control method according to claim 13, wherein FETs are used as the switching semiconductor devices; control signals of wave forms for use in converting between the ON states and OFF states of the switching semiconductor devices having a plurality of threshold levels by employing the differences between the threshold levels are inputted to the gate terminals of the FETs to thereby convert the conducting state to the non-conducting state of the conducting path and vice versa.

15. A switching circuit having switching semiconductor devices connected between an input terminal and an output terminal thereof for switching between a conducting state and a non-conducting state of a conducting path between the input terminal and the output terminal thereof in accordance with a control signal inputted thereto from outside, the switching circuits comprises:

two or more switching semiconductor devices connected in parallel to each other between the input terminal and the output terminal thereof; and a control circuit for controlling converting between conducting states and non-conducting states of the two or more switching semiconductor devices, wherein the switching semiconductor devices are converted between ON states and OFF states thereof by comparing threshold levels with either control current levels or control voltage levels thereof; a threshold level for each of the switching semiconductor devices is set differently in accordance with the converting sequence of the ON states and OFF states thereof; and the control circuit outputs either the control current levels or the control voltage levels of a wave form signal for use in converting the ON state and OFF state of each of the switching semiconductor devices individually by employing the difference between the threshold levels.

16. A switching circuit having switching semiconductor devices connected between an input terminal and an output terminal thereof for switching between a conducting state and a non-conducting state of a conducting path between the input terminal and the output terminal thereof in accordance with a control signal inputted thereto from outside, the switching circuit comprises:

two or more switching semiconductor devices connected in parallel to each other between the input terminal and the output terminal thereof, wherein the two or more switching semiconductor devices have at least one switching semiconductor device having a higher switching speed than the other switching semiconductor devices; and a control circuit for controlling conversion between conducting states and non-conducting states of the two or more switching semiconductor devices.

17. The switching circuit according to claim 15 or 16, further comprises a switching semiconductor device having a lower saturation voltage between corresponding terminals than the other switching semiconductor devices.

18. The switching circuit according to claim 15 or 16, further comprises a switching semiconductor device having a higher current conducting capacity than the other switching semiconductor devices.

19. The switching circuit according to claim 16, wherein the control circuit includes means for initially setting one switching semiconductor device in ON state when the conducting path is setting in the conducting state in accordance with the control signal, said one switching semiconductor device having a higher switching speed from an OFF state to an ON state than the other switching semiconductor devices.

20. The switching circuit according to claim 15 or 16, wherein the control circuit includes means for initially setting one switching semiconductor device in ON state in accordance with the control signal when the conducting path is setting in the conducting state and after setting said one switching semiconductor device in an ON state and then setting the other switching semiconductor device in an ON state if a voltage between terminals of said one switching semiconductor device reaches around a saturation value thereof.

21. The switching circuit according to claim 15 or 16, wherein the control circuit includes means for performing switching another switching semiconductor device from an OFF state to an ON state after setting one switching semiconductor device in an ON state when the conducting path is setting in the conducting state in accordance with the control signal if a voltage between terminals of the switching semiconductor device set in the ON state just prior to said another switching semiconductor device decreases to a predetermined percent of a voltage between terminals of said one switching semiconductor device at the moment that said one switching semiconductor device is set in an ON state.

22. The switching circuit according to claim 16, wherein the control circuit includes means for lastly setting one switching semiconductor device in an OFF state when the conducting path is setting in the non-conducting state in accordance with the control signal, said one switching semiconductor device having a higher switching speed from an ON state to an OFF state than the other switching semiconductor devices.

23. The switching circuit according to claim 15 or 16, wherein the control circuit includes means for lastly setting a predetermined switching semiconductor devices in an OFF state after setting all switching semiconductor devices except the predetermined switching semiconductor devices in OFF states when the conducting path is setting in the non-conducting state.

24. The switching circuit according to claim 15, wherein the control circuit includes:

means, when the conducting path is setting in the conducting state in accordance with the control signal, for setting another switching semiconductor device to an ON state, a saturated voltage between terminals of said another switching semiconductor being lower than those of the other devices; and means, when the conducting path is setting in the non-conducting state, for setting all switching semiconductor devices except a predetermined switching semiconductor devices in OFF states, said predetermined switching semiconductor devices having a lowest saturated voltage between terminals thereof.

25. The switching circuit according to claim 15 or 16, wherein the control circuit includes means, when the conducting path is converted from the non-conducting state to the conducting state, for employing other switching semiconductor devices sequentially as the switching semiconductor device which has been initially set in the ON state.

26. The switching circuit according to claim 15 or 16, wherein the control circuit includes means, when the conducting path is setting in the conducting state, for setting each of the switching semiconductor devices in an ON state one by one in increasing order of the switching speed from an OFF state to an ON state thereof.

27. The switching circuit according to claim 16, wherein the switching semiconductor devices are converted between ON states and OFF states thereof by comparing threshold levels with either control current levels or control voltage levels thereof; a threshold level for each of the switching semiconductor devices is set differently in accordance with the converting sequence of the ON states and OFF states thereof; and the control circuit outputs either the control current levels or the control voltage levels of a wave form signal for use in converting the ON state and OFF state of each of the switching semiconductor devices individually by employing the difference between the threshold levels.

28. The switching circuit according to claim 27, wherein FETs are used as the switching semiconductor devices; and the control circuit inputs control voltage levels of wave forms for use in converting between the ON states and OFF states of the switching semiconductor devices having a plurality of threshold levels to the gate terminals of the FETs by employing the differences between the threshold levels to thereby convert the conducting state to the non-conducting state of the conducting path and vice versa.

29. An electronic switching component comprising:

a package;

two input/output outer terminals exposed from the package;

two or more switching semiconductor devices formed in the package connected in parallel between the two input/output outer terminals, wherein at least one of said two or more switching semiconductor devices has switching property different from those of the other switching semiconductor devices; and one or more outer control terminals connected to each of the switching semiconductor devices, wherein said one or more outer control terminals are exposed from the package.

30. The electronic switching component according to claim 29, wherein a switching semiconductor device has higher switching speed from an OFF state to an ON state than the other switching semiconductor devices.

31. The electronic switching component according to claim 29, wherein a switching semiconductor device has higher switching speed from an ON state to an OFF state than the other switching semiconductor devices.

32. The electronic switching component according to claim 29, wherein a switching semiconductor device has a lower saturation voltage between corresponding terminals than the other switching semiconductor devices.

33. The electronic switching component according to claim 29, wherein said outer control terminals are formed in each of the switching semiconductor devices.

34. An electronic switching component comprising a package, two input/output outer terminals and one or more outer control terminals exposed from the package, switching semiconductor devices formed in the package connected between the two input/output outer terminals and a control circuit to control the conversion between the ON/OFF stats of the switching semiconductor devices in accordance with a control signal inputted thereto from the outer control terminal, wherein the switching circuit according to either of claim 15 or claim 16 is formed in said package.

35. An electronic switching control component for inputting an ON/OFF control signal and then outputting two or more device control signals for use in controlling two or more semiconductor devices in accordance with the ON/OFF control signal, the component comprising:

a package;

a control signal input terminal exposed from the package for inputting the ON/OFF control signal;

two or more device control signal output terminals exposed from the package for outputting said two or more device control signals; and a control circuit formed in the package, wherein the control circuit includes means for outputting a device control signal to convert from an OFF state to an ON state to a device control signal output terminal in response to the ON/OFF control signal and then after a predetermined time period, outputting a device control signal to convert from an ON state to an OFF state to a device control signal output terminal.

36. The electronic switching control component according to claim 35, further comprising:

a voltage detecting terminal exposed from the package; and means for comparing a detected voltage applied to the voltage detecting terminal from outside with a predetermined converting threshold voltage, wherein when the control circuit outputs a device control signal to convert an OFF state to an ON state in response to the ON/OFF control signal, Lhe control circuit outputs a device control signal to convert an OFF state to an ON state to a control signal output terminal and then based on the comparison result obtained the comparing means, outputs a device control signal to convert an OFF state to an ON state for the other control signal output terminal after the detected voltage reaches around the converting threshold voltage.

37. The electronic switching control component according to claim 35, further comprising:

a voltage detecting terminal exposed from the package;

three or more control signal output terminals; and means for comparing a detected voltage applied to the voltage detecting terminal from outside with two different converting threshold voltages, wherein when the control circuit outputs a device control signal to convert an OFF state to an ON state in response to the ON/OFF control signal, the control circuit outputs a device control signal to convert an OFF state to an ON state to a control signal output terminal and then based on the comparison result obtained by the comparing means, outputs a device control signal to convert an OFF state to an ON state for the other control signal output terminal at every converting threshold voltages after the detected voltage reaches around the converting threshold voltages.

38. The electronic switching control component according to claim 35, wherein when the control circuit outputs a device control signal to convert an ON state to an OFF state in response to the ON/OFF control signal, the control circuit outputs a device control signal to convert an ON state to an OFF state to all control signal output terminals except a predetermined one control signal output terminal and then outputs a device control signal to convert an ON state to an OFF state for the predetermined one control signal output terminal.

* * * * *